(12) United States Patent
Coldren et al.

(10) Patent No.: US 6,195,485 B1
(45) Date of Patent: Feb. 27, 2001

(54) DIRECT-COUPLED MULTIMODE WDM OPTICAL DATA LINKS WITH MONOLITHICALLY-INTEGRATED MULTIPLE-CHANNEL VCSEL AND PHOTODETECTOR

(75) Inventors: Larry A. Coldren, Santa Barbara; Syn-Yem Hu, San Jose, both of CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 09/425,542

(22) Filed: Oct. 22, 1999

Related U.S. Application Data

(60) Provisional application No. 60/105,704, filed on Oct. 26, 1998.

(51) Int. Cl.[7] .................................................. G02B 6/30
(52) U.S. Cl. ............................................................ 385/49
(58) Field of Search .................................. 385/14–15, 24, 385/33, 37, 4, 10; 372/45, 50, 96, 36; 438/47, 29, 46

(56) References Cited

U.S. PATENT DOCUMENTS

| | | |
|---|---|---|
| 4,773,074 | 9/1988 | Hunsperger et al. . |
| 4,948,960 | 8/1990 | Simms et al. . |
| 5,432,630 | 7/1995 | Lebby et al. . |
| 5,450,508 | 9/1995 | Decusatis et al. . |
| 5,532,856 | 7/1996 | Li et al. . |
| 5,546,209 | 8/1996 | Willner et al. . |
| 5,568,574 * | 10/1996 | Tamguay et al. ...................... 385/14 |
| 5,633,527 | 5/1997 | Lear . |
| 5,671,304 | 9/1997 | Duguay . |
| 5,678,002 | 10/1997 | Puzey . |
| 5,684,308 | 11/1997 | Lovejoy et al. . |
| 5,724,376 * | 3/1998 | Kish, Jr. et al. ...................... 372/96 |
| 5,837,561 * | 11/1998 | Kish, Jr. et al. ...................... 438/24 |
| 6,055,262 * | 4/2000 | Cox et al. ............................ 372/45 |

OTHER PUBLICATIONS

Hu, S. et al., "Resonant–cavity InGaAs/InAlGaAs/InP photodetector arrays for wavelenght demultiplexing applications", Applied Physics Letters, vol. 70, No. 18. pp. 2347–2349, May 5, 1997.

Hu, S. et al., "1.55 micron pie–shaped resonant–cavity photodetector arrays for direct–coupled wavelength demultiplexing applications", Electrnic Letters Online No. 19970992, (2 pages), Jun. 25, 1997.

Hu, S. et al., "Coupled–cavity resonant photodetectors for high–performance wavelength demultiplexing applications", Applied Physics Letters, vol. 71, pp. 178–180, Jul. 14, 1997.

* cited by examiner

*Primary Examiner*—Akm E. Ullah
(74) *Attorney, Agent, or Firm*—John P. O'Banion

(57) ABSTRACT

A low cost, high speed WDM optical link which employs a circular array of VCSEL emitters directly coupled to a multi-mode fiber through which multiple simultaneously optical transmissions are sent to an optical detector comprising a circular array of RCPD detectors receiving the multiple simultaneous transmissions. The emitters and detectors within each array are fabricated with a double-absorber design which avoids position sensitivity related to the cavity standing wave and eliminates the need for in-situ cavity-mode adjustment. In addition, a coupled-cavity structure is presented to achieve passbands with flat tops and steep sides to approach the ideal square-shape photoresponse and to ensure proper channel alignment.

11 Claims, 19 Drawing Sheets

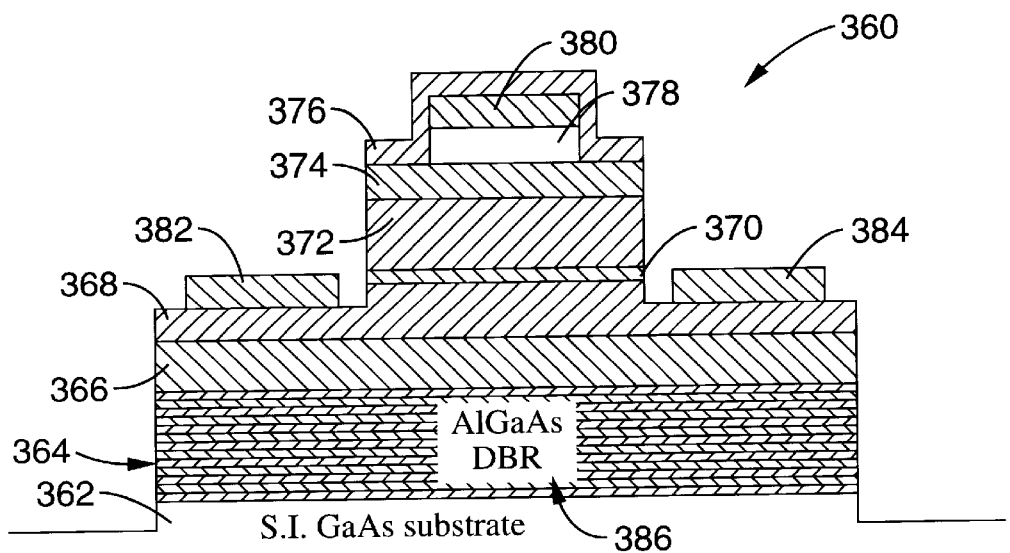
FIG. — 22
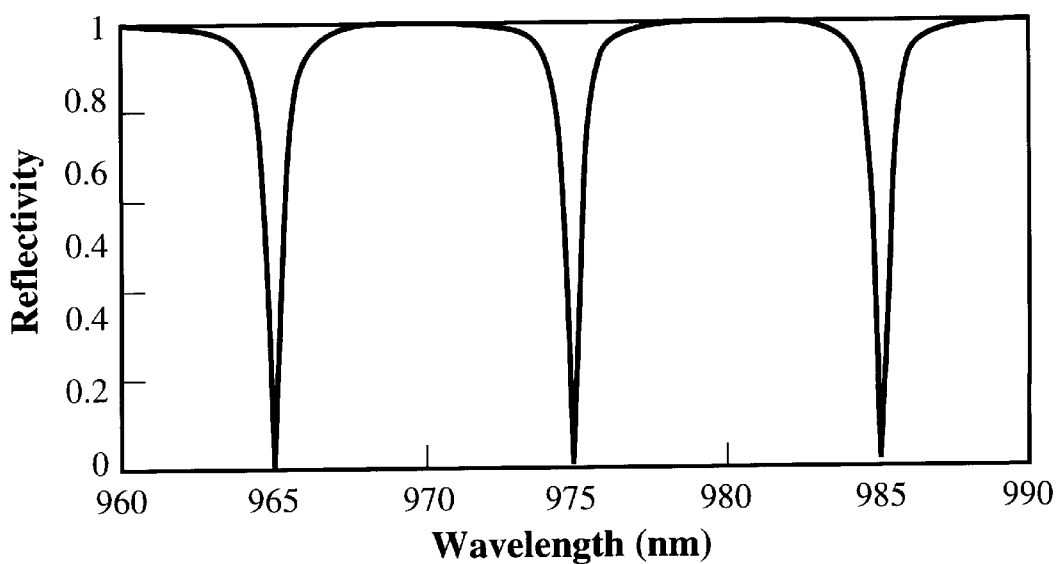
FIG. — 23

DIRECT-COUPLED MULTIMODE WDM OPTICAL DATA LINKS WITH MONOLITHICALLY-INTEGRATED MULTIPLE-CHANNEL VCSEL AND PHOTODETECTOR

CROSS-REFERENCE TO RELATED APPLICATIONS

This application claims priority from U.S. provisional application Ser. No. 60/105,704 filed on Oct. 26, 1998.

STATEMENT REGARDING FEDERALLY SPONSORED RESEARCH OR DEVELOPMENT

This invention was made with Government support under Grant No. DAAH04-95-1-0624, awarded by the Army. The Government has certain rights in this invention.

REFERENCE TO A MICROFICHE APPENDIX

Not Applicable

INCORPORATION BY REFERENCE

The following publications which are referred to herein using a number in square brackets (e.g., [1]) are incorporated herein by reference.

[1] S. Y. Hu, J. Ko, E. R. Hegblom, and L. A. Coldren, "Multimode WDM optical data links with monolithically-integrated multiple-channel VCSEL and photodetector arrays," IEEE J. Quantum Electron., vol. 34, pp.——, August 1998.

[2] S. Y. Hu, J. Ko, and L. A. Coldren, "High-performance densely-packed vertical-cavity photonic integrated emitter arrays for direct-coupled WDM applications," IEEE Photon. Technol. Leff., vol. 10, pp.766–768, June 1998.

[3] S. Y. Hu, J. Ko, E. R. Hegblom, and L. A. Coldren, "High-performance multiple-wavelength vertical-cavity photonic integrated emitter arrays for direct-coupled multimode optical links," Proc. CLEO'98 conference, San Francisco, Calif., May 3–8, 1998, paper no. CThK1, Invited.

[4] S. Y. Hu, S. Z. Zhang, J. Ko, J. E. Bowers, and L. A. Coldren, "1.5 Gb/s/ch operation of multiple-wavelength vertical-cavity photonic integrated emitter arrays for low-cost WDM local-area networks," Electron. Lett., vol. 34, No. 8, pp. 768–770, April 1998.

[5] S. Y. Hu, J. Ko, O. Sjolund, and L. A. Coldren, "Optical crosstalk in monolithically-integrated multiple-wavelength vertical-cavity laser arrays for multimode WDM local-area networks," Electron. Left., vol. 34, No. 7, pp. 676–678, April 1998.

[6] S. Y. Hu, E. R. Hegblom, and L. A. Coldren, "Multiple-wavelength top-emitting vertical-cavity photonic integrated emitter arrays for direct-coupled wavelength-division multiplexing applications" Electron. Lett., vol. 34, No. 2, pp. 189–190, January 1998.

[7] L. A. Coldren, E. R. Hegblom, Y. A. Akulova, J. Ko, E. M. Strzelecka, and S. Y. Hu, "VCSELs in '98: What we have and what we can expect," SPIE Proceedings, San Jose, Calif., January 28–29, Vol. 3286, 1998.

[8] S. Y. Hu, E. R. Hegblom, and L. A. Coldren, "Multiple-wavelength top-emitting vertical-cavity laser arrays for wavelength-division multiplexing applications," Proc. 10th IEEE LEOS annual meeting, San Francisco, Calif., Nov. 10–13, 1997, postdeadline paper PD1-6.

[9] S. Y. Hu, J. Ko, and L. A. Coldren, "Pie-shaped resonant-cavity InGaAs/InAlGaAs/InP photodetector arrays for direct-coupled wavelength demultiplexing applications," Proc. 10th IEEE LEOS annual meeting, San Francisco, Calif., November 10–13, 1997, Paper TuJ4.

[10] S. Y. Hu, J. Ko, and L. A. Coldren, "1.55-$\mu$m pie-shaped resonant-cavity photodetector arrays for direct-coupled wavelength demultiplexing applications," Electron. Lett., vol. 33, pp. 1486–1488, August 1997.

[11] S. Y. Hu, E. R. Hegblom, and L. A. Coldren, "Coupled-cavity resonant photodetectors for high-performance wavelength demultiplexing applications," Appl. Phys. Lett., vol. 71, pp.178–180, July 1997.

[12] S. Y. Hu, J. Ko, and L. A. Coldren, "Resonant-cavity InGaAs/InAlGaAs/InP photodetector arrays for wavelength demultiplexing applications," Appl. Phys. Lett., vol. 70, pp. 2347–2349, May 1997.

[13] E. C. Vail, G. S. Li, W. Yuen, and C. J. Chang-Hasnain, "High performance and novel effects of micromechanical tunable vertical-cavity lasers," IEEE J. Select. Topic Quantum Electron., vol. 3, pp. 691–697, 1997.

[14] T. Wipiejewski, J. Ko, B. J. Thibeault, and L. A. Coldren, "Multiple wavelength vertical-cavity laser array employing molecular beam epitaxial regrowth," Electron. Lett., vol. 32, pp. 340–342,1996.

[15] D. L. Huffaker and D. G. Deppe, "Multiwavelength, densely-packed 2×2 verticalcavity surface-emitting laser array fabricated using selective oxidation," IEEE Photon. Technol. Lett., vol. 7, pp. 858–860, 1996.

[16] W. Yuen, G. S. Li, and C. J. Chang-Hasnain, "Multiple-wavelength vertical-cavity surface-emitting laser arrays," IEEE J. Select. Topic Quantum Electron., vol. 3, pp. 422–428, 1997.

[17] A. Fiore, Y. A. Akulova, E. R. Hegblom, J. Ko, and L. A. Coldren, "postgrowth tuning of cavity resonance for multiple-wavelength laser and detector arrays" Proc. CLEO'98 conference, San Francisco, Calif., May 3–8, 1998, paper no. CThX3.

[18] H. Hasegawa, K. E. Forward, and H. Hartnagel, "Improved method of anodic oxidation of GaAs", Electron. Left., Vol.11, pp. 53–54,1975.

[19] K. H. Hahn, M. R. T. Tan, Y. M. Houng, and S. Y. Wang, "Large area multitransverse-mode VCSELs for modal noise reduction in multimode fiber systems," Electron. Left., vol. 29, pp.1482–1483, 1993.

[20] C. A. Burrus and B. I. Miller, "Small-area double heterostructure AlGaAs electroluminescent diode sources for optical fiber transmission lines," Opt. Commun., vol. 4, pp. 307–309, 1971.

BACKGROUND OF THE INVENTION

1. Field of the Invention

This invention pertains to device structures and simple packaging schemes to realize low-cost, yet high-performance, multimode wavelength-division multiplexing (WDM) optical data links.

2. Description of the Background Art (a) Introduction

The demand for ever faster data transmission rates (a few Gb/s up to 100 Gb/s) has attracted considerable interest in the development of high-capacity optical data links for short-haul local-area networks and fiber-to-the-desktop applications. The majority of work to date has focused on one-dimensional parallel optical data links which utilize multimode fiber ribbons with a one-data-channel-per-fiber arrangement. However, the maximum aggregate data transmission rate is limited to about 2–3 gigabytes per second and the system configuration is costly and very complicated.

One definitive solution to the bandwidth problem is to take advantage of the extra-wide bandwidth of optical fibers by employing the wavelength-division multiplexing (WDM) configuration which can significantly expand the transmission capacity by having multiple data channels in each fiber. With WDM, however, the corresponding transmitter and receiver modules must be low cost to be attractive for emerging "gigabytes-to-the-desktop" applications. A problem with WDM is that any additional complexity in device fabrication and packaging technology can dramatically increase the manufacturing cost. The availability of such low-cost multiple-wavelength emitter and detector arrays is also a key issue for the realization of ultra-high-density multiple-layer digital versatile disk technology. Obviously, the vertical-cavity device structure is the ideal candidate for WDM configurations because the resonant wavelength can be easily varied and its fiber packaging is potentially low-cost.

(b) VCSEL Emitters in Optical Data Links

With the inherent advantages of its two-dimensional configuration, efficient fiber coupling, and on-wafer testing capability, VCSEL (Vertical-Cavity Surface-Emitting Laser) structures have remained the preferred candidate for free-space interconnects and optical fiber communication since inception. Within the last decade, there have been numerous advances in epitaxial technology, device design, and processing techniques such that the performance of VCSELs has been greatly improved. Currently, major accomplishments in VCSEL technology have been demonstrated in the 0.8–1.00 $\mu$m wavelength regime, where VCSELs are being incorporated into many advanced optical systems as a high-performance and yet low-cost solution for short-distance communications.

VCSELs are the ideal laser structures for the implementation of wavelength-division multiplexing (WDM) systems because the lasing wavelength can be easily varied by adjustment of the cavity length. However, due to the difficulty of achieving convenient and high-reflectivity distributed-Bragg reflector (DBR) mirrors in the longwavelength (1.3–1.55 $\mu$m) regime, in-plane distributed feedback (DFB) laser arrays have been the traditional structures in long-haul WDM optical communications. On the other hand, It is difficult to make in-plane DFB lasers at 0.8–1.00 $\mu$m for short-haul optical communications, and VCSEL technology at 0.8–1.00 $\mu$m has matured to a point where it is possible to build VCSEL-based WDM optical data links for short-haul optical interconnects.

In recent years, micromechanically tunable VCSELs [13] and monolithically integrated multiple-wavelength VCSEL arrays [14]–[17] have been reported by various groups for free-space or fiber communications. Some of these can be incorporated into the present invention. In particular, the anodic oxidation scheme [18] or postgrowth tuning scheme [17] can easily provide the required device density and arbitrary wavelength variation within a small region. These also allow one to perform very flexible and accurate cavity-mode adjustment. The following discussion focuses on the utilization of anodic oxidation in the production of multiple-wavelength VCSEL PIE arrays.

To illustrate the wavelength adjustment of VCSELs using the anodic oxidation approach, the well-established 0.98 $\mu$m VCSEL design with pseudomorphic InGaAs/GaAs quantum wells (QWs) and AlGaAs/GaAs DBRs will now be discussed.

FIG. 1 provides an example of the aluminum and indium composition profiles for a multiple-wavelength bottom-emitting VCSEL [1]–[5]. The laser structure consists of a 32-period top p-mirror and a 19.5-period output n-mirror. The compositions for the AlGaAs quarter-wave layers are pure AlAs for the first 18 periods of the n-DBR and $Al_{0.9}Ga_{0.1}As$ for the rest of the structure, except for the oxide-aperturing layer which is located in the first AlGaAs quarter-wave layer above the active region and has a 400 Å $Al_{0.98}Ga_{0.02}As$ layer in the middle for selective lateral oxidation. The active region consists of three 80 Å InGaAs QWs with 120 Å GaAs barriers in between. To achieve multi-wavelength VCSEL PIE arrays by anodic oxidation requires two epitaxial growths. The first growth stops at the GaAs phase-tuning layer and then cavity modes for the individual channels are adjusted by performing anodic oxidation on this phase-tuning layer prior to the growth of the rest of the top DBR mirror. In FIG. 1, the phase-tuning layer is the fourth GaAs layer above the 1-$\lambda$ cavity, where $\lambda$ is the Bragg wavelength of the DBRs. The effects of choosing different tuning layer locations are covered in the following discussion.

FIG. 2A shows the corresponding calculated lasing wavelength, while FIG. 2B shows the corresponding threshold gain per quantum well as a function of the location and thickness of the GaAs phase-tuning layer. The number, m, shown beside each curve denotes that the tuning layer is the m-th GaAs layer above the 1-$\lambda$ cavity. For the special case: m=0, the tuning layer is the 1-$\lambda$ cavity itself. When m>0 and if the GaAs tuning layer is 0.75-$\lambda$ (point A in the figure), it behaves just like a normal quarter-wave layer and the device will lase at the Bragg wavelength $\lambda$. However, when the GaAs tuning layer is 0.5-$\lambda$ or 1.0-$\lambda$ (points B and C in the figure), this layer itself becomes a second cavity in the whole structure with the same cavity mode as the original 1-$\lambda$ cavity. As a result, there will be a splitting in energy levels $\lambda$ points B and C) due to the mode-coupling effect. The amount of splitting decreases as the cavity separation increases but the wavelength-tuning curve becomes more and more nonlinear. Theoretically, the tuning curve will gradually change from a straight line of slope $2\lambda/n_s^2$ to a straight line of zero slope when m increases from 0 to $\lambda$. Here $n_s$ is the refractive index of the cavity. In order to achieve equidistant wavelength separation, a small m value, such as m=0 or at most m=1, should be used. Under this circumstance, the freespectral range is wider so that the available wavelength span is also larger than the designs with a larger m. However, the overall variation in device threshold currents to achieve this maximum wavelength span will be much greater, as illustrated in FIG. 2B. Moreover, the tolerance in process control of the anodic oxidation also becomes tighter because of the steeper wavelength tuning rates. For current short-distance coarse WDM applications, it is possible to use the m=3 or even m=4 design because the channel spacing is still much wider than 4 nm, which is mainly limited by the receiver bandwidth.

In both FIG. 2A and FIG. 2B, the threshold characteristics of the adjacent higher-order and lower-order modes for the m=4 case (solid lines) are shown to illustrate the mode-coupling effect at the two ends of the free spectral range. This coupling effect caused not only nonlinearity but also an abrupt switch in device threshold and lasing wavelength. The observed systematic variation in threshold characteristics comes from the extending of optical field intensity from the central 1-$\lambda$ gain cavity into the GaAs phase-tuning layer when the cavity mode is detuned away from the Bragg wavelength of the DBRs. Another factor that also causes reduction in optical confinement factor is the shift of optical standing-wave peak away from the InGaAs QWs.

Consequently, threshold current will have its lowest value at the Bragg wavelength and goes up in either direction of wavelength. In particular, when the tuning layer thickness is outside the (0.5λ, 1.0λ) range, the adjacent modes have lower threshold gains than the central mode and thus will dominate the lasing behavior.

The mode splitting at the 1.0-λ tuning layer thickness determines the maximum available wavelength span. FIG. 3 shows the maximum lasing wavelength span and the required maximum threshold gain per well as a function of m. The solid curves are for the design shown in FIG. 1; while the dotted curves and the experimental data (0) are for the special case when we increase the first GaAs layer below the 1-λ cavity to 1.25-λ to avoid exposing AlGaAs layers on the etched surface. In reality, however, devices will not lase if the required threshold gain is higher than what the active material can provide, especially when the tuning layer thickness is close to 0.5λ or 1.0λ. If the maximum optical gain is experimentally limited to only 2400 cm$^{-1}$ from each $In_{0.2}Ga_{0.8}As$ quantum well, the solid curve of the maximum wavelength span has to be reduced to the dash-dotted curve by excluding those wavelength ranges where the required threshold gain is beyond 2400 cm$^{-1}$ per quantum well. The curves suggest that m=2 would be the optimal design for providing the widest wavelength-tuning span whose wavelength-tuning characteristics are not overly steep. The latter is an important consideration for the processing control of anodic oxidation.

The above analysis and designs can be applied to other material systems at various wavelength regimes as well. The principle issue is the capability of performing successful epitaxial regrowth over the phase-tuning layer which can be GaAs, AlGaAs, InAlGaAs, InGaAsP, or others. For example, low-Al-content AlGaAs is very likely to be the tuning layer for 0.85-μm WDM VCSEL PIE arrays so that high-quality AlGaAsAlGaAs over-growth interface has to be achieved for the above mentioned regrowth method. However, we can also use dielectric DBR mirrors, transverse wet oxidation [17], or other techniques to vary the resonant wavelengths if the regrowth technology is not available.

In addition, modal noise is a well-known phenomenon for multimode fiber systems when a coherent light source is used. For a multimode WDM link, if single-mode VCSELs are used at the transmitter part, output intensity profile for each VCSEL channel at the other end of the fiber will be very likely centered in a few spots which are distributed over the 62.5 μm-diameter core in an unpredictable manner. Moreover, these spots will move around the fiber core when the fiber is bent or vibrated somewhere. Therefore, broad bandwidth multimode VCSELs are recommended for multimode WDM systems [19] to produce a uniform intensity profile at the fiber output. In our designs, an oxide aperture extending only 1.0 μm from the edges of VCSELs is created to reduce optical losses for the high-order modes to facilitate multiple lateral-mode operation.

(c) RCPDs in Optical Data Links

Narrow-band monolithically-integrated RCPD arrays are needed for real-time spectroscopic analysis or parallel demultiplexing of wavelength-encoded channels [9]–[12]. The key issue in design is to achieve high quantum-efficiency and narrow-band square-like photoresponse. Traditionally, there are two major approaches: one by RCPDs and the other by multiple-cavity dielectric filters combined with discrete photodetectors. Because of the large numerical aperture associated with multimode fibers, the RCPD approach is expected to be much better than the other to generate narrow-band photoresponse [1].

In view of the foregoing, a need exists for a direct coupled-multimode WDM data link with monolithically-integrated multiple-channel VCSEL and photodiodes arrays. The present invention satisfies that need, as well as others, and overcomes deficiencies in prior approaches.

BRIEF SUMMARY OF THE INVENTION

The present invention is a direct-coupled optical data link structure for low-cost multimode wavelength-division multiplexing (WDM) in high-capacity (a few Gb/s up to 100 Gb/s) local-area network or fiber-to-the-desktop applications. This link comprises novel monolithically-integrated multiple-channel vertical-cavity surface-emitting laser (VCSEL) and narrow-band resonant-cavity photodetector (RCPD) arrays with their emitting or photon-collecting elements closely-packed within a small diameter circular area to facilitate self-aligned coupling to a single multimode fiber [1]–[12]. For multimode fibers, the devices are contained within a 60 μm circle or alternately sized areas for matching to different fiber cores. For other fibers, this size may be varied to properly inject light from the VCSEL elements into the guided fiber modes. Unlike other techniques for making multiple wavelength laser or photodetector arrays, the present invention allows a multiple-channel VCSEL/RCPD link to be packaged in the same manner as a single-channel data link without resorting to complicated and expensive waveguide-coupling optics. Furthermore, one may then combine in parallel several of these direct-coupled WDM links to a fiber ribbon cable to thereby multiply the overall system capacity.

In order to achieve high-performance monolithically-integrated multiple-channel VCSEL and RCPD arrays at a low cost, the invention employs a circular device arrangement to obtain uniform and efficient fiber coupling. The individual VCSELs or RCPDs of the array can be designed with a conventional circular shape or a unique "pie"-like shape to maximize the light-emitting or photon-collecting area. Wavelength adjustment can be performed by several methods, including anodic oxidation and regrowth or post-growth variable oxidation. The focus of these methods is to provide precisely-controlled anodic oxidation with a convenient binary-coding method. The advantage of this method over prior modified growth wavelength-adjustment techniques is that it can easily provide the required device density and arbitrary wavelength variation within a small photolithographically-defined region. For the VCSEL-transmitters, a unique and manufacturable planar-surface VCSEL structure is employed to facilitate device packaging. The idea is to define the VCSEL pillars, i.e. the closely-packed photonic-integrated emitter (PIE) array, by etching a narrow deep trench (about 3–5 μm wide) around the VCSEL pillars and filling up the trench with an insulator, such as polyimide, which facilitates the addition of the metal crossovers. On the RCPD-receiver side, the simplest broadcast-type configuration is adapted in this link, and wavelength-selective narrow-band RCPDs are achieved by minimizing cavity losses and increasing cavity length, i.e., to maximize the cavity Q-factor. A novel double quantum-well absorber design has been used to ensure a uniform photoresponse over the whole wavelength range covered by the RCPD array. In addition, a novel coupled-cavity structure is proposed to achieve passbands with flat tops and steep sides to ensure proper channel alignment.

An object of the invention is to provide a method whereby low cost wavelength division multiplexed (WDM) optical link may be produced.

Another object of the invention is to provide for inexpensively packaging the multiple channels of a WDM optical link without the need of waveguide-coupling optics.

Another object of the invention is to provide a method of creating planar surface VCSELs which are easy to manufacture.

Another object of the invention is to provide general guidelines for WDM VCSEL array design, whether planar or not.

Further objects and advantages of the invention will be brought out in the following portions of the specification, wherein the detailed description is for the purpose of fully disclosing preferred embodiments of the invention without placing limitations thereon.

BRIEF DESCRIPTION OF THE DRAWINGS

The invention will be more fully understood by reference to the following drawings which are for illustrative purposes only:

FIG. 22 is a schematic cross-section view for a P-i-N photodetector according to the present invention.

FIG. 23 is a graph of theoretical reflectivity spectra for positions under the Au back mirror at predetermined tuning layer thicknesses, for the structure shown in FIG. 22.

DETAILED DESCRIPTION OF THE INVENTION

Figure 1:
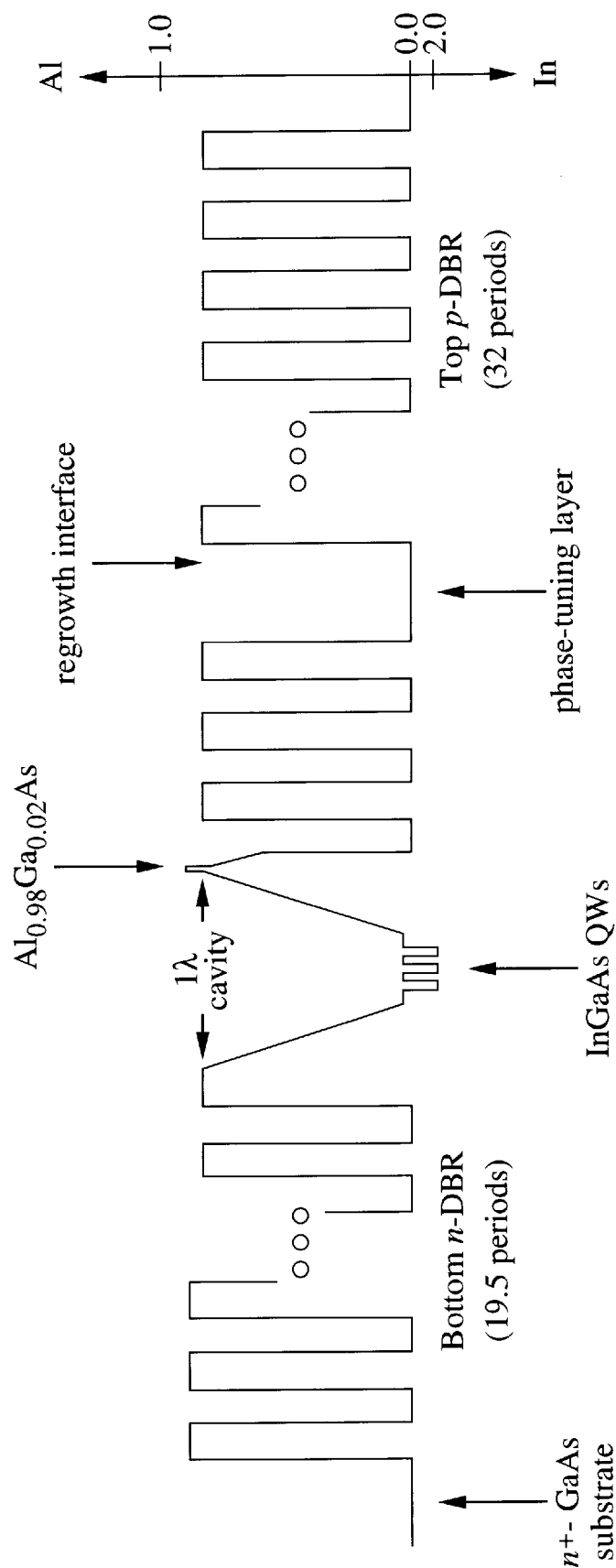
FIG. 1 is a diagram showing an example of the aluminum and indium composition profiles for a multiple-wavelength bottom-emitting VCSEL.
Figure 2A:
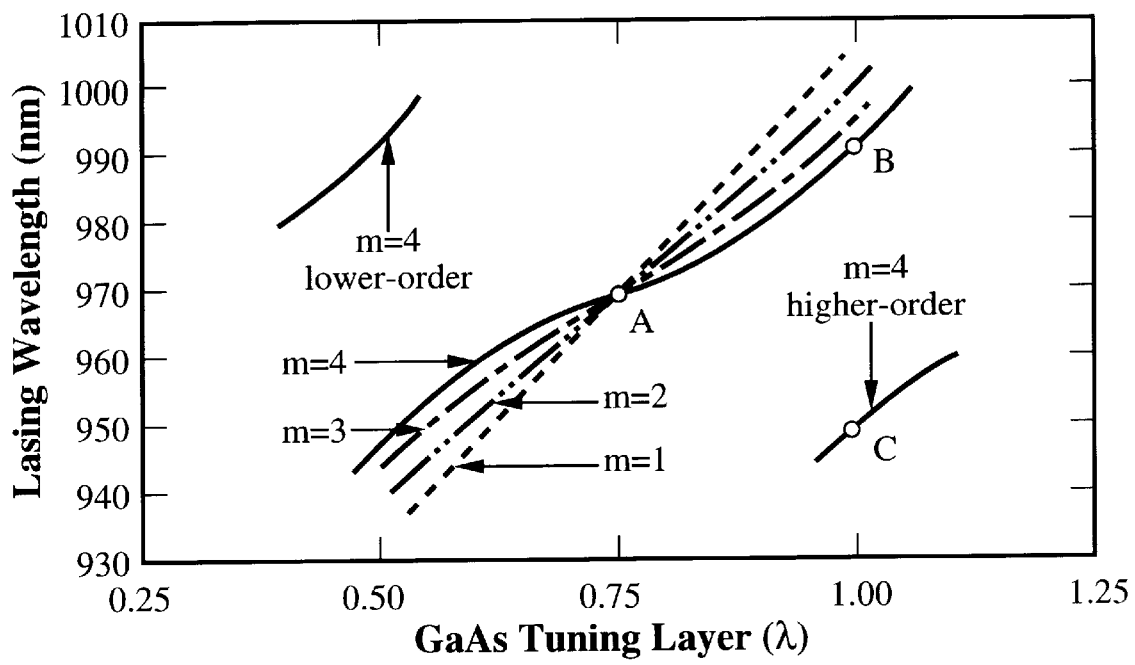
FIG. 2A and FIG. 2B are graphs of calculated lasing wavelength and threshold gain, respectively, per quantum well as a function of the location and thickness of the GaAs phase-tuning layer for a multiple-wavelength bottom emitting VCSEL.
Figure 2B:
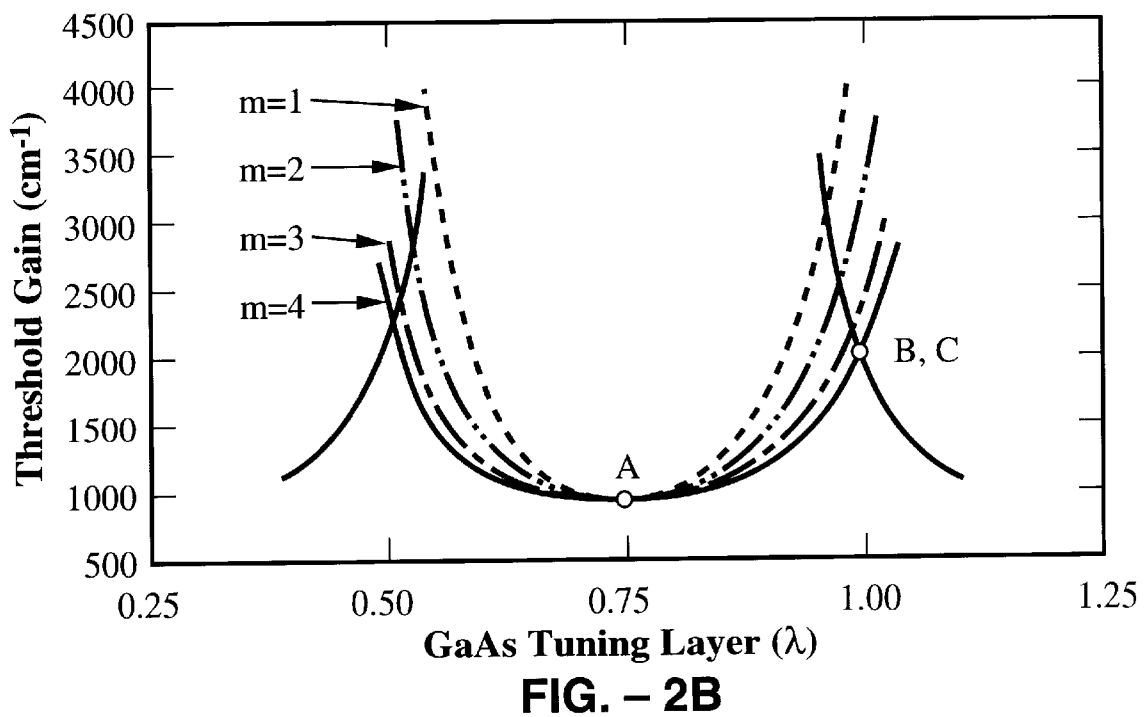
Figure 3:
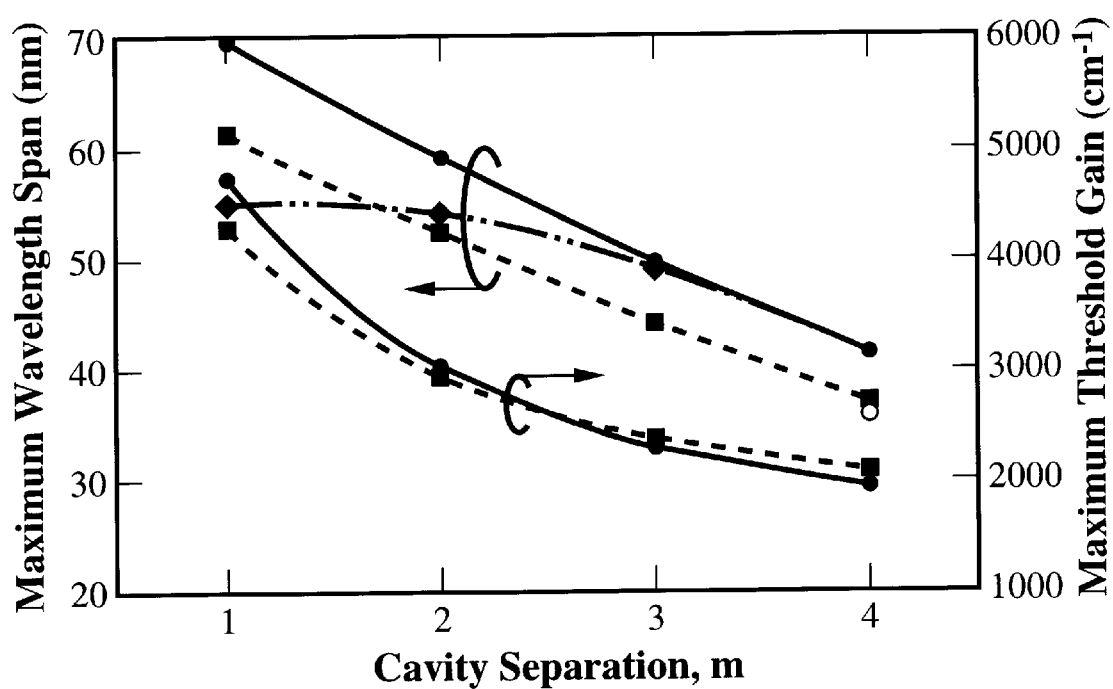
FIG. 3 is a graph showing the maximum lasing wavelength span and the required maximum threshold gain per well as a function of m for a multiple-wavelength bottom-emitting VCSEL.
Figure 4:
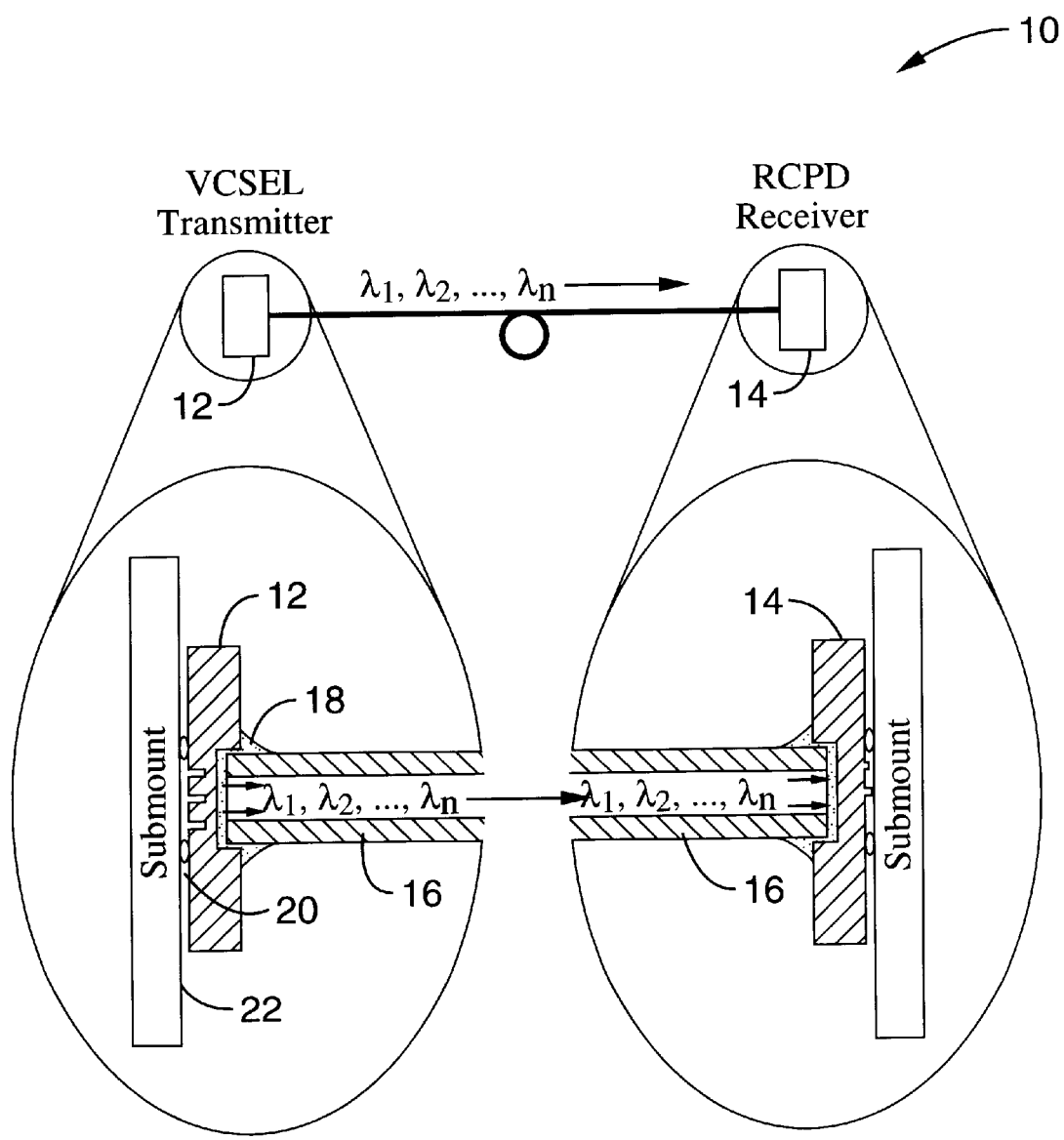
FIG. 4 shows a schematic multimode WDM optical data link according to the present invention.
Figure 5:
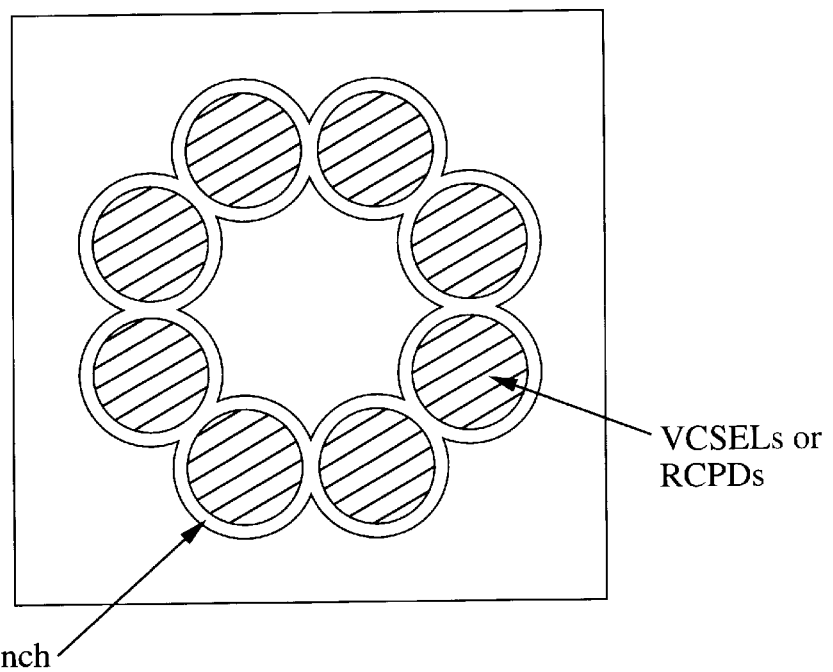
FIG. 5 shows the layout of an array of VCSELs or RCPDs having a conventional circular shape.
Figure 6:
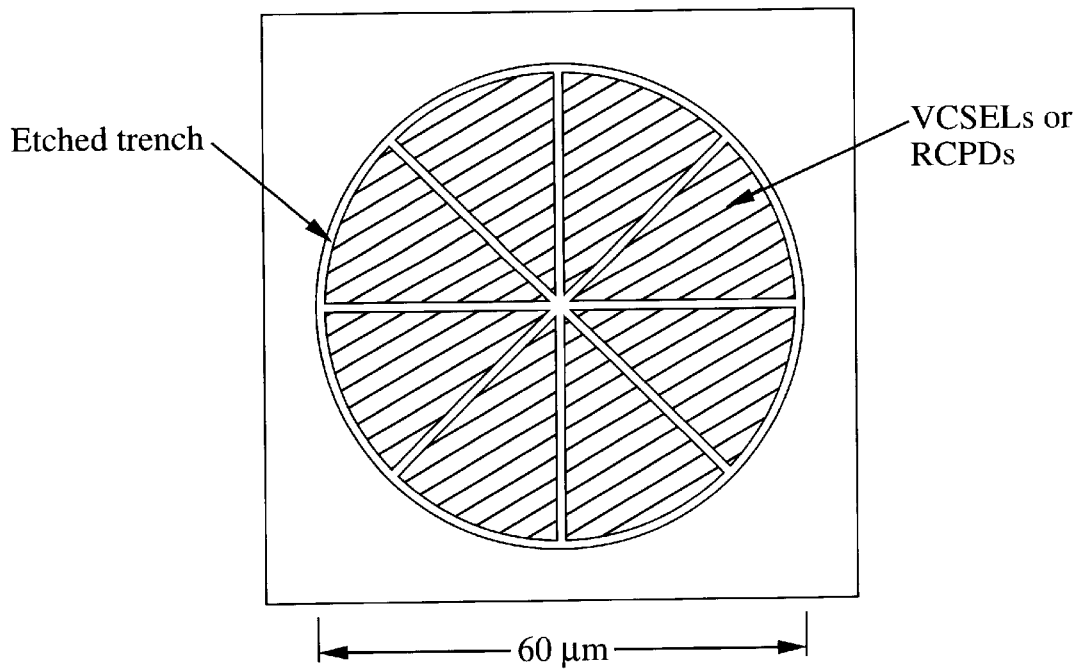
FIG. 6 show the layout of an array of VCSELs or RCPDs having a "pie" shape.

Referring first to FIG. 4, a schematic diagram of a multimode WDM optical data link 10 according to the present invention is shown. In this diagram, wavelength-encoded optical signals are transmitted from a monolithically-integrated multiplewave-length VCSEL array 12 to a channel-matched wavelength-selective photodetector array 14 via a single multimode fiber 16 without using any waveguide combiner or distributor. This is achieved by circularly arranging all array elements within the area of a fiber core so that the whole array can be simultaneously coupled to a single fiber by one alignment procedure. The multimode fiber 16 is shown interfacing with the transmitter array 12 and receiver array 14 by means of an epoxy bond 18. The individual VCSELs or RCPDs of the arrays can be designed with a conventional circular shape as shown in FIG. 5 or the "pie" shape as shown in FIG. 6. Ideally, both laser and photodetector arrays should have planar-surface structures to facilitate further device packaging. Additionally in order that the arrays be mass-produced they must be easy to manufacture. A detailed description of the transmitter and receiver designs follow and additionally a sampling of preliminary experimental results is provided.

(a) VCSEL Transmitters

Figure 7:
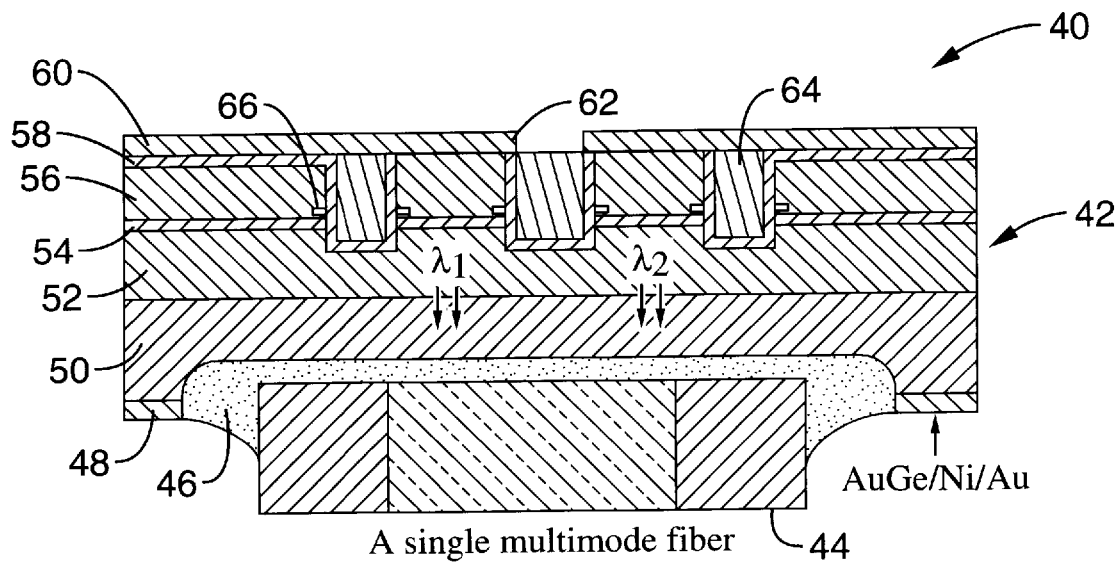
FIG. 7 is a schematic cross-section of a multiple-wavelength bottom-emitting VCSEL PIE array with a self-aligned Burrus-type fiber-coupling configuration according to the present invention.
Figure 8:
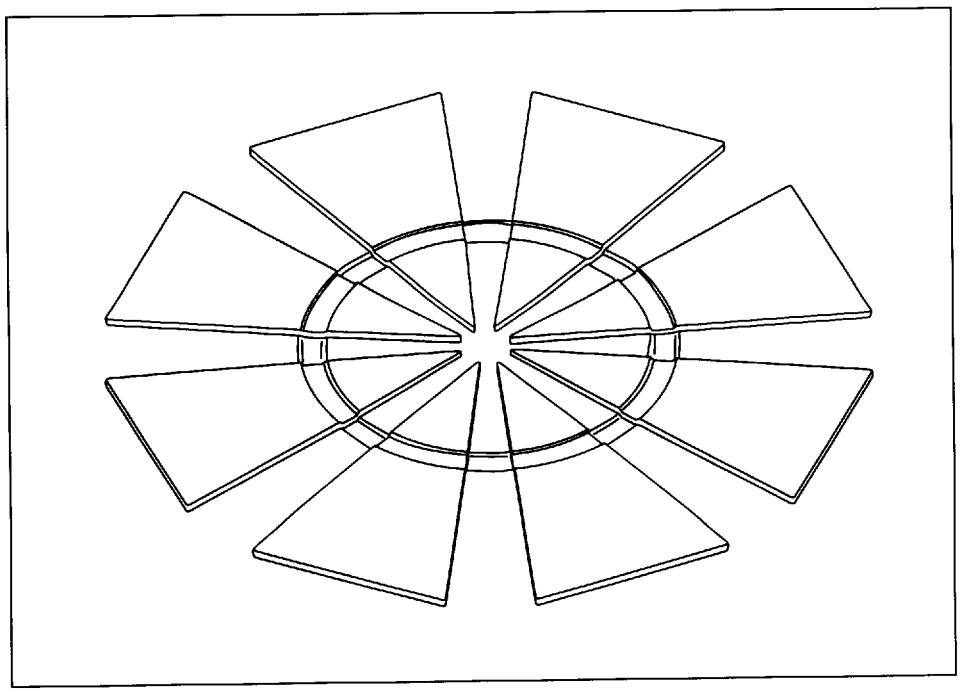
FIG. 8 diagrammatically depicts a finished bottom-emitting VCSEL PIE array corresponding to FIG. 7.

Both bottom-emitting and top-emitting VCSELs can be used for the transmitter modules via different packaging methods. FIG. 7 shows a schematic cross-section for a multiple-wavelength bottom-emitting VCSEL PIE array 40 formed on a substrate 42. A multimode fiber 44 with self-aligned Burrus-type [20] fiber-coupling configuration is attached to the substrate with epoxy 46. The substrate 42 of this embodiment is preferably comprised of the following series of layers: an AuGe/Ni/Au layer 48 for n-contact metallization, a GaAs substrate layer 50, an n-DBR layer 52, an active layer 54, a p-DBR layer 56, an insulating isolation layer 58, and a layer of Ti/Pt/Au 60 for contacting the p-DBR and for probing pads. Within this structure are shown an insulating, isolation layer 62 of, for example $SiN_x$, and polyimide 64 wells and oxide apertures 66. FIG. 8 is a rendering of a scanning-electron micrograph (SEM) image of a finished bottom-emitting VCSEL PIE array which comprises eight "pie-shaped" VCSELs emitting eight different wavelengths. This structure corresponds to the configuration shown in FIG. 6. The exact number of elements in each array will be determined by the specific applications. However, the upper limit is usually set by processing techniques and device performance. Additionally, note that the "pie" shape is not essential. Other VCSEL shapes such as circles, triangles or squares may also be used as long as they fit within the circumference of the fiber core to which the VCSEL PIE array is to be attached.

Figure 9:
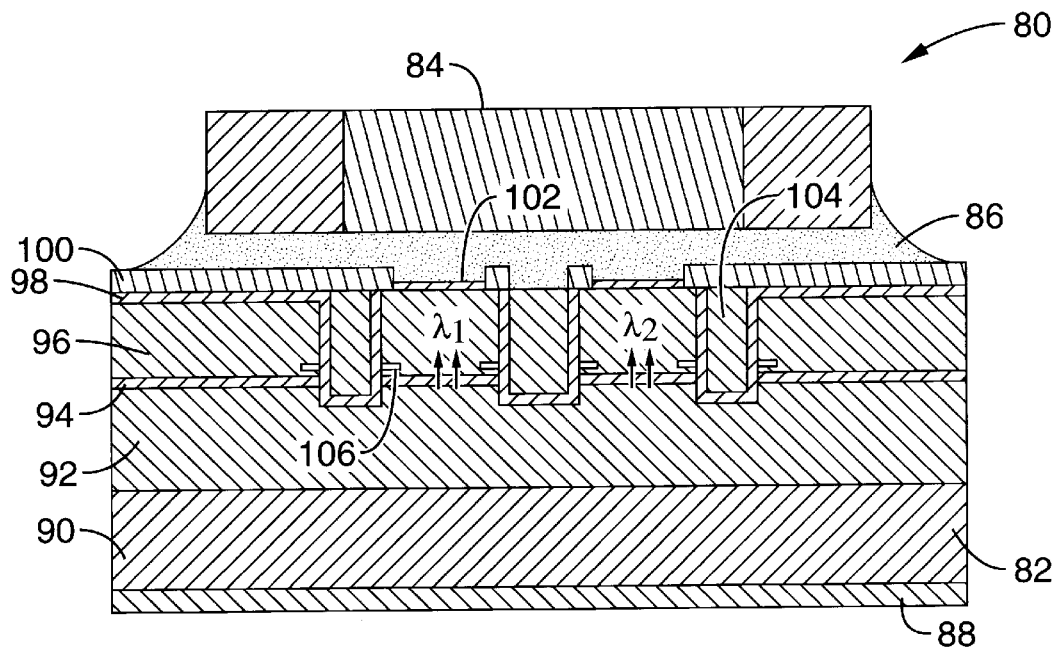
FIG. 9 is a schematic cross-section of a multiple-wavelength top-emitting VCSEL PIE array with a self-aligned Burrus-type fiber-coupling configuration according to the present invention.
Figure 10:
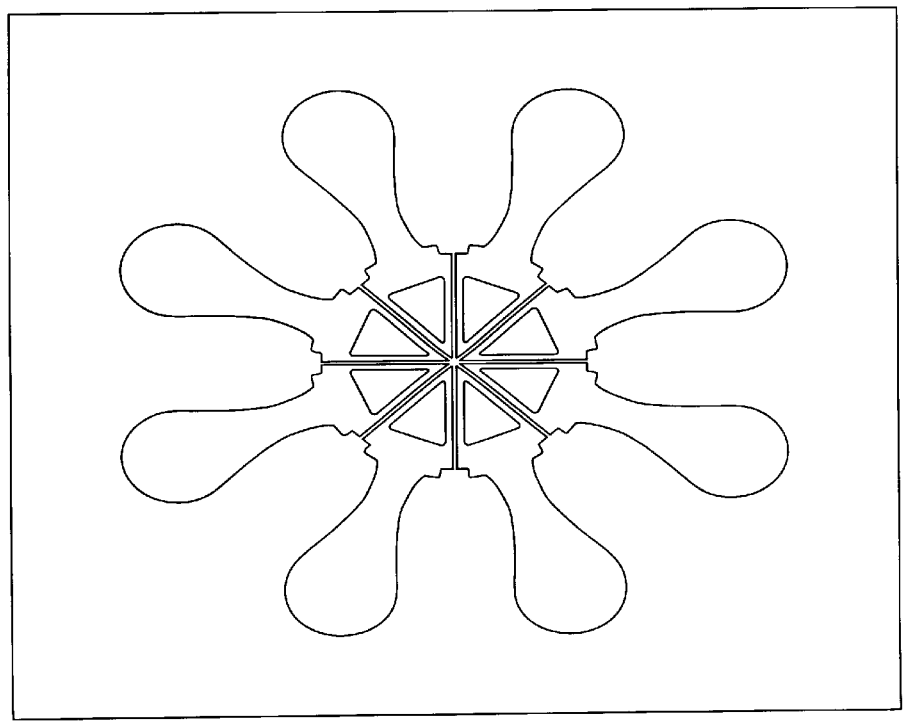
FIG. 10 diagrammatically depicts a finished top-emitting VCSEL PIE array corresponding to FIG. 9.

Similarly, FIG. 9 and FIG. 10 illustrate the corresponding top-emitting approach. FIG. 9 shows a schematic cross-section for a proposed multiple-wavelength top-emitting VCSEL PIE array 80 formed on a substrate 82. A multimode fiber 84 is attached to the substrate with epoxy 86. The substrate 82 of this embodiment preferably comprises the following series of layers: an AuGe/Ni/Au layer 88 for n-contact metallization, a GaAs substrate layer 90, an n-DBR layer 92, an active layer 94, and a p-DBR 96, an insulating isolation layer 98, with a layer of Ti/Pt/Au 100 for contacting the p-DBR and for probing pads. Within this structure are shown a $SiN_x$ 102 anti-reflection coating and polyimide 104 wells along with oxide apertures 106.

FIG. 10 is a rendering of a scanning-electron micrograph (SEM) image of a finished top-emitting VCSEL PIE array which comprises eight VCSELs emitting eight different wavelengths. This metallization retains the previous "pie" structure yet employs circular contact areas.

The processing steps for the foregoing VCSEL PIE arrays is as follows. After epitaxial regrowth, the sample is patterned with photoresist for etching of the deep narrow trenches (3–5 µm wide) around the VCSELs for device isolation and access to the wet oxidation layer. As a result, arrays of eight pie-shaped VCSEL mesas were created after a pure C12 reactive-ion etching. These eight VCSELs are closely packed within a 60-µm-diameter circle to match the core of a multimode fiber. In order to avoid having an exposed $Al_{0.9}Ga_{0.1}As$ layer at the bottom of the trenches, the first GaAs quarter-wave layer below the active region was designed with a thickness of 1.2 λ and the C12 etching was controlled to stop within this layer. After the trench etching, a short 2.5 minute wet oxidation process at 425° C. is performed to create an oxide aperture extending only 1.0 µm from the edge to facilitate multiple lateral-mode operation. Then the sample is covered with $SiN_x$ and the film on top of the VCSELs is removed by $CF_4/O_2$ plasma for Au/Zn/Au metallization.

Figure 11:
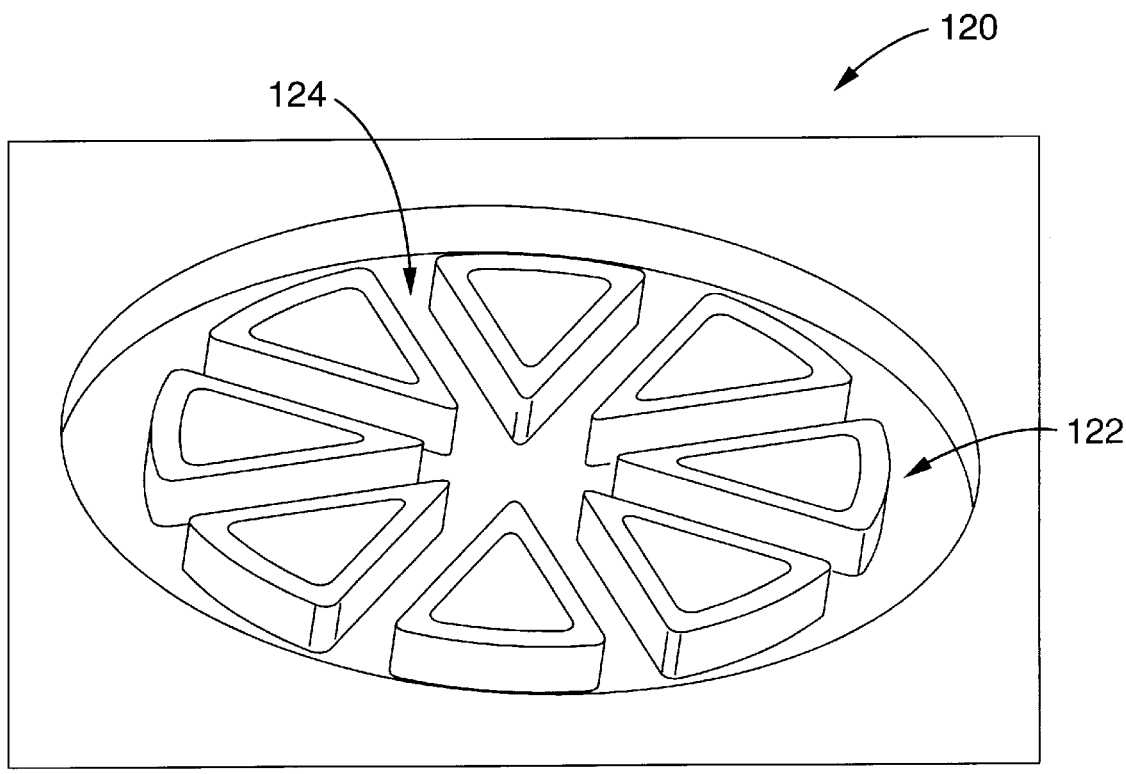
FIG. 11 diagrammatically depicts a bottom-emitting VCSEL PIE array according to the present invention after undergoing the p-contact process.

FIG. 11 is a rendering of a scanning-electron micrograph (SEM) image 120 of the bottom-emitting VCSEL PIE array after the p-contact process. Before putting down the thick Ti/Pt/Au probing pads, the deep trenches 122, 124 are filled with polyimide for metal cross-over and isolation, respectively. The n-contact metallization on the substrate side of the sample is AuGe/Ni/Au. $SiN_x$ is used for anti-reflection coating on the bottom-emitting VCSELs. For the Burrus-type packaging scheme, an etching well is created in the substrate for self-aligned fiber coupling and also for better coupling efficiency.

Figure 12A:
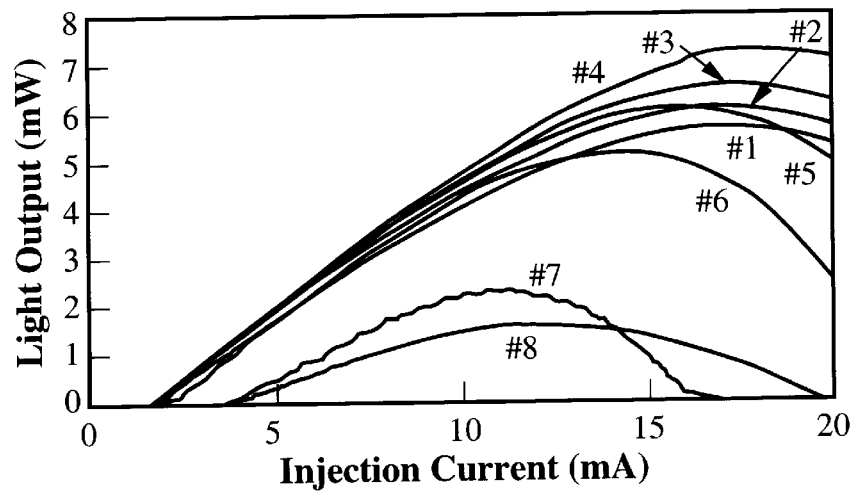
FIG. 12A through FIG. 12C are graphs of the experimental light-current for an eight-element bottom-emitting VCSEL PIE array according to the present invention.
Figure 12B:
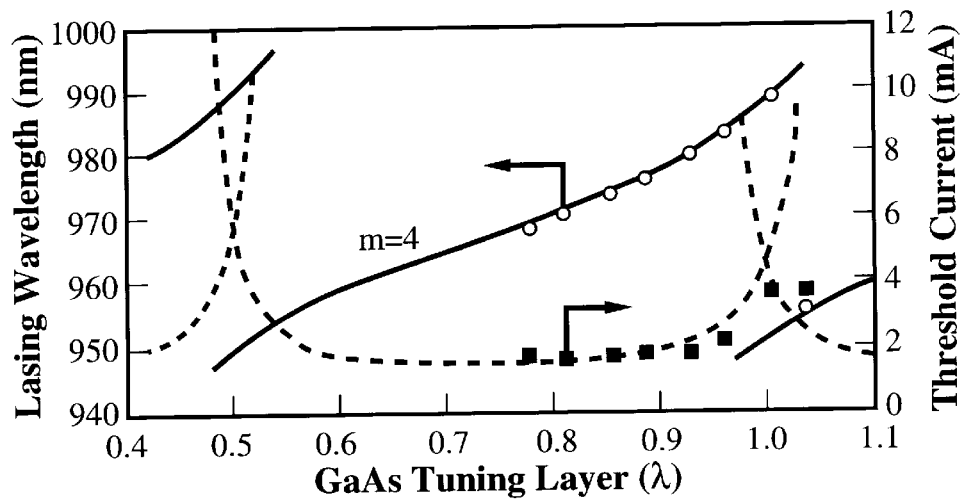
Figure 12C:
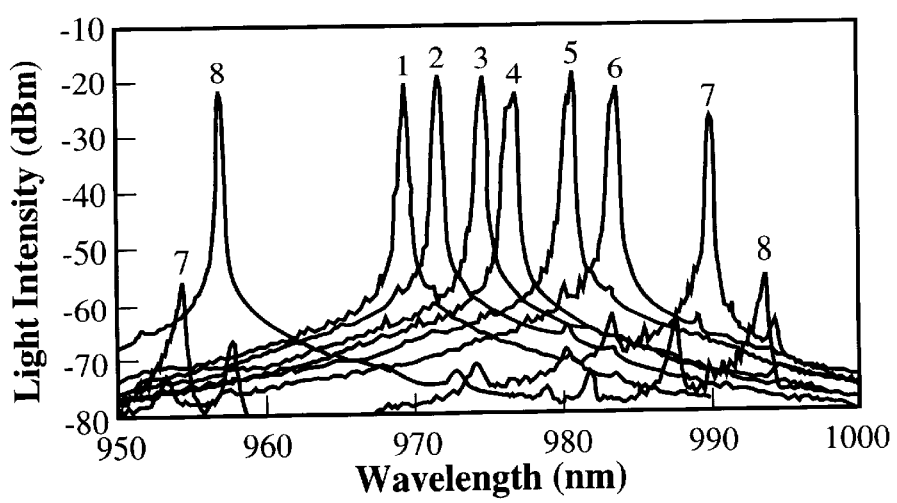

FIG. 12A shows the experimental light-current curves for an eight-element bottom-emitting VCSEL PIE array with the design shown in FIG. 11 (m=4) but also with a 1.25-λ GaAs layer below the 1-λ cavity for the reason described earlier. FIG. 12B shows the corresponding experimental and theoretical threshold characteristics. Most devices lased at around 1.7 mA with a bias voltage of 2.4 V. If we number the devices according to the tuning layer thickness, channels #1 to #6 exhibit similar electrical and spectral characteristics when the output power is below 5 mW. Channel #4 has 7.3 mW maximum output power, 50.2% differential quantum efficiency, and 11.8% maximum wall-plug efficiency. As theoretically predicted, the device (channel #8) with a GaAs tuning layer over 1.0 λ lases at the adjacent higher-order mode. FIG. 12C shows the lasing spectra of this VCSEL PIE array measured at 5–6 mA. The achieved lasing wavelength span from this array is 32.9 nm, but the maximum available wavelength span is about 36.7 nm. From FIG. 12B one can see that only half of the usable tuning range has been used by this sample. It is possible to further optimize the channel allocation so that all eight channels can be located at the flat part of the threshold curve.

Figure 13A:
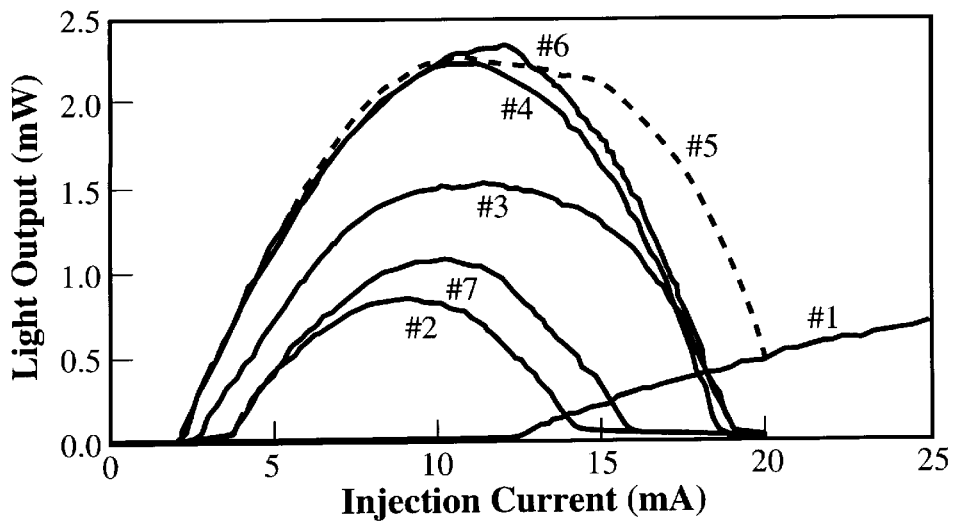
FIG. 13A through FIG. 13C are graphs of threshold characteristics and lasing spectra of a top-emitting VCSEL PIE array according to the present invention.
Figure 13B:
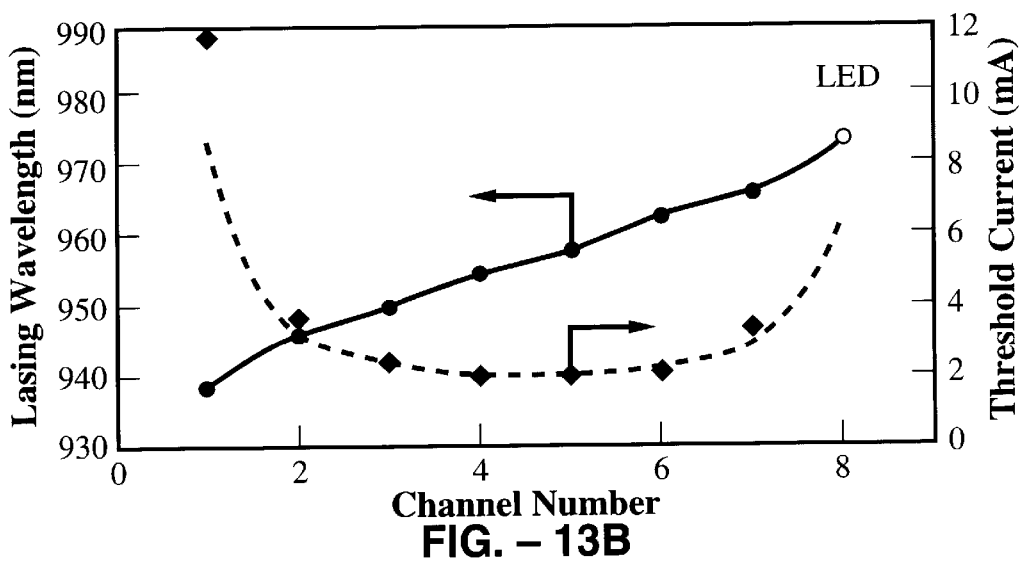
Figure 13C:
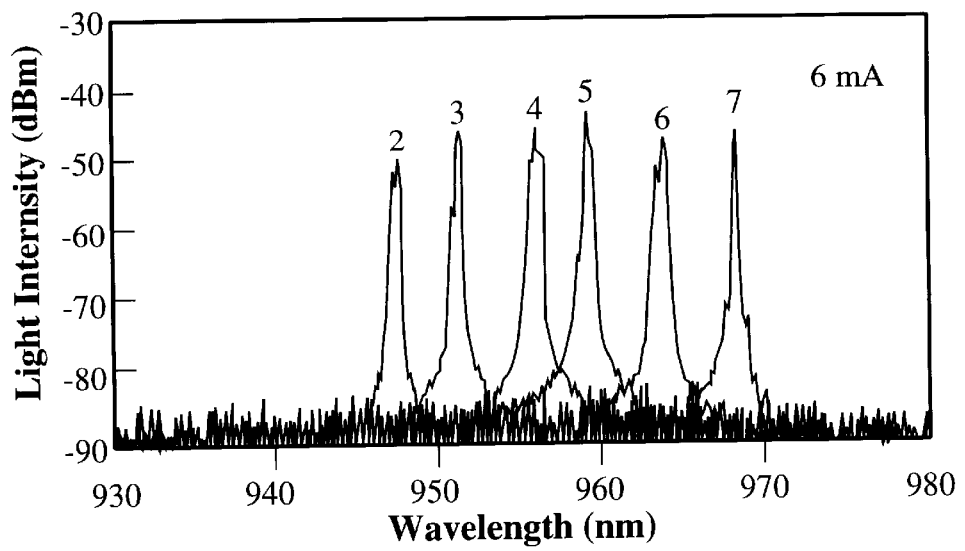

Similarly, FIG. 13A through FIG. 13C show the corresponding threshold characteristics and lasing spectra of the top-emitting VCSEL PIE arrays, respectively.

Figure 14:
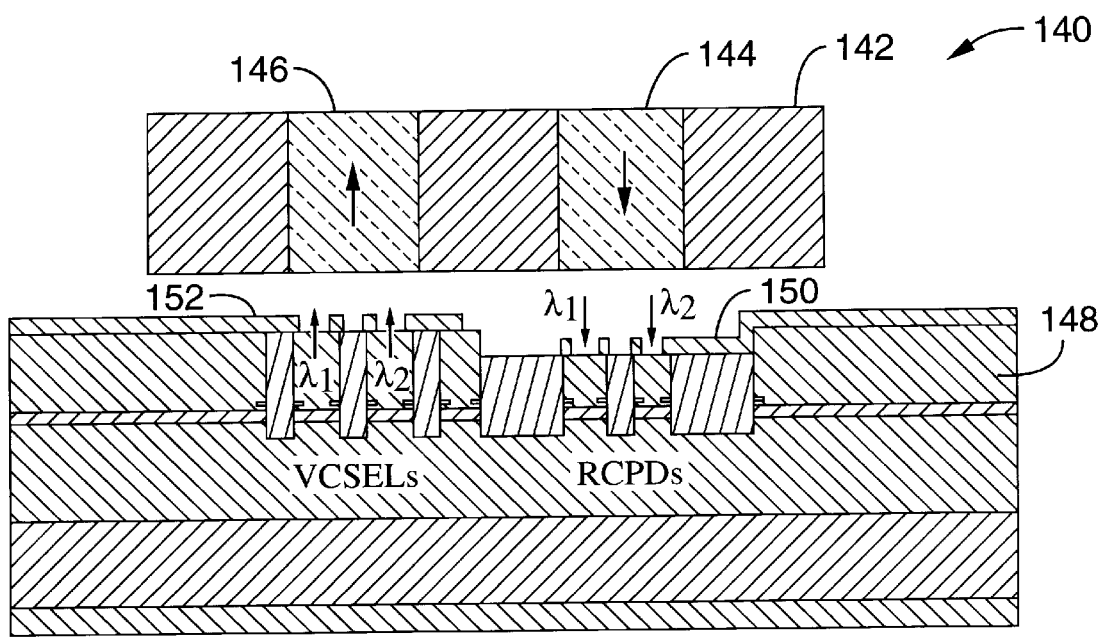
FIG. 14 is a schematic cross-section of a top-emitting VCSEL structure according to the present invention.

From the system point of view, the bottom-emitting VCSEL PIE scheme is preferred over the top-emitting version because the bottom-emitting version provides a larger emitting area for each array element which will, in turn, enhance the multimode operation that is recommended for multimode fiber systems [19]. Moreover, the bottom-emitting configuration is also compatible with the flip-chip bonding 20 as shown in FIG. 4 which provides adequate heat sinking for reducing thermal crosstalk between channels. However, the top-emitting VCSEL structure has the advantage of being able to monolithically integrate with wavelength-matched RCPD arrays, simply by etching off a few periods of the top DBR mirror of VCSELs which turns them into reasonably effective photodetectors [1], whose structure 140 is illustrated in FIG. 14. The structure shows both a dual-core multimode fiber 142 with a receiving fiber 144, and a transmission fiber 146. Both the receiving fiber 144 and transmission fiber 146 can be attached to the substrate 148 with its respective RCPDs 150 and VCSELs 152 in a single operation. In the embodiment shown, it is desirable to use the transparent indium-tin-oxide (ITO) top contact to avoid the difficulty in photolithographical alignment. In addition, sometimes it is also desirable to adapt the top-emitting scheme to avoid the substantial substrate absorption, such as 850 nm wavelength for GaAs substrates.

Figure 15:
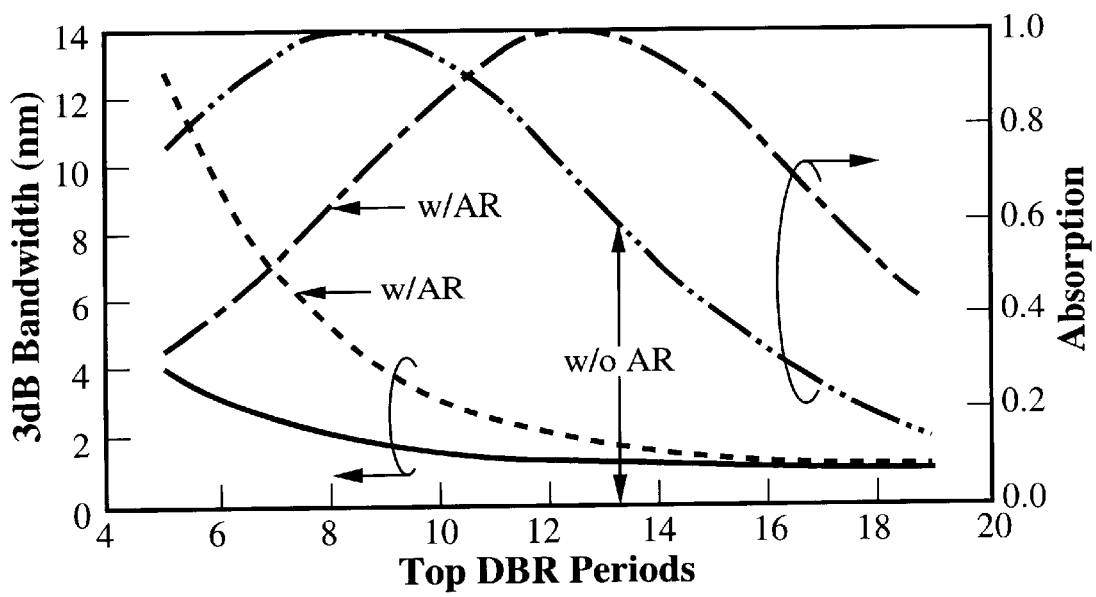
FIG. 15 is a graph of bandwidth absorption for a top-emitting VCSEL structure as shown in FIG. 14.

FIG. 15 gives theoretical design characteristics of the photodetector of FIG. 14. Both the 3 db optical bandwidth and the fraction of light absorbed are shown for a variable number of DBR panels in the top mirror.

Figure 16A:
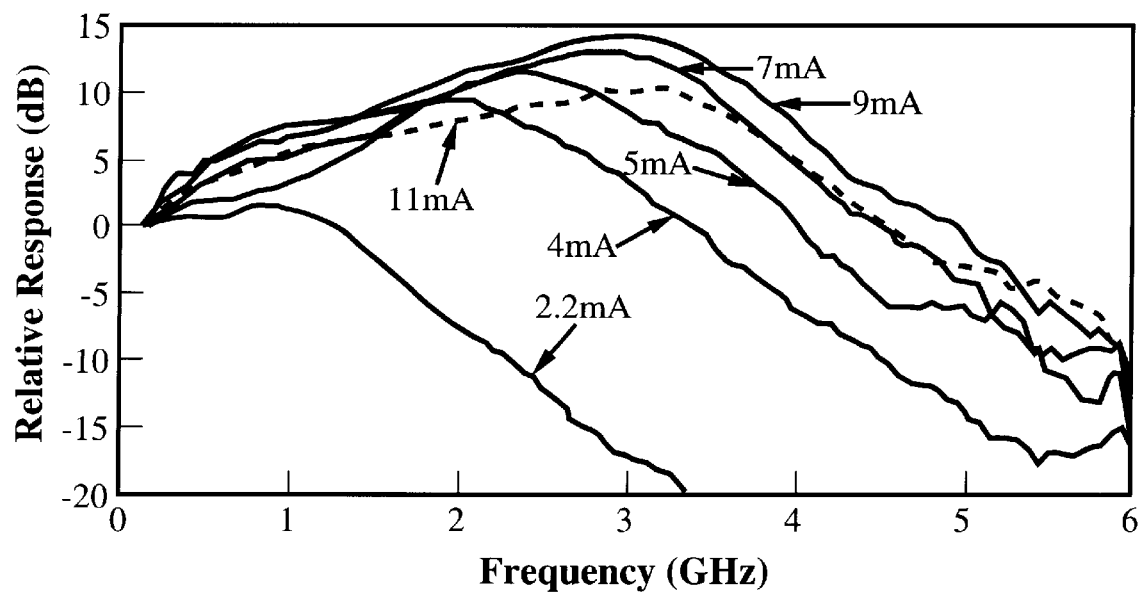
FIG. 16A is a graph of modulation responses as a function of frequency at various bias levels for the bottom-emitting VCSEL of FIG. 7.
Figure 16B:
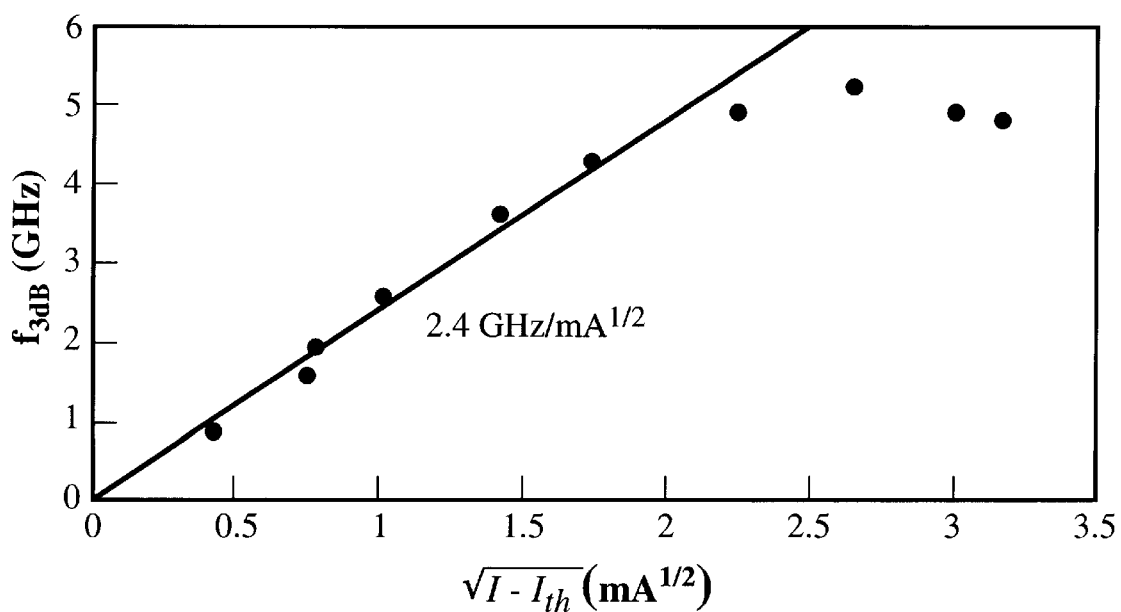
FIG. 16B is a graph of 3dB modulation bandwidth, $f_{3dB}$, as a function of $(I-I_{th})^{1/2}$ where I is the bias current and $I_{th}$ is the threshold current for the bottom-emitting VCSEL of FIG. 7.

Preliminary on-chip high-speed testing of the bottom-emitting VCSEL PIE arrays of the current embodiment, as in FIG. 7, has been performed using a modified coaxial probe [4]. Laser output was collected by a 62.5 µm-core graded-index fiber at the substrate side. FIG. 16A shows the typical modulation responses at various bias levels measured by a 20 GHz lightwave component analyzer. FIG. 16B shows the 3dB modulation bandwidth, $f_{3dB}$, as a function of $(I-I_{th})^{1/2}$, where I is the bias current and Ith is the threshold current. The observed modulation current efficiency factor is 2.4 GHz/mA$^{1/2}$, which is similar to that for a conventional 15 μm-diameter etched-post VCSEL which has about the same area as our "pie"-shape VCSEL (88λμm$^2$). The RC-limited bandwidth of our devices is estimated to be around 6.5 GHz, which is close to what we have obtained. An additional proton implantation under the probing pads will be very helpful to reduce the parasitic capacitance. Data transmission through a 300m-long graded-index multimode fiber (with a 62.5-μm core diameter) has been performed by using an O/E converter as the receiver. The results show that these devices, designed without particular high-speed consideration, are already capable of transmitting data up to 1.5 Gb/sec/channel under a 223-1 pseudo-random bit sequence (PRBS) without error (<10–13 bit-error rate). Additional proton implantation or semi-insulating substrate approach will bring up the high-speed modulation performance at the expense of more complicated processing.

Figure 17:
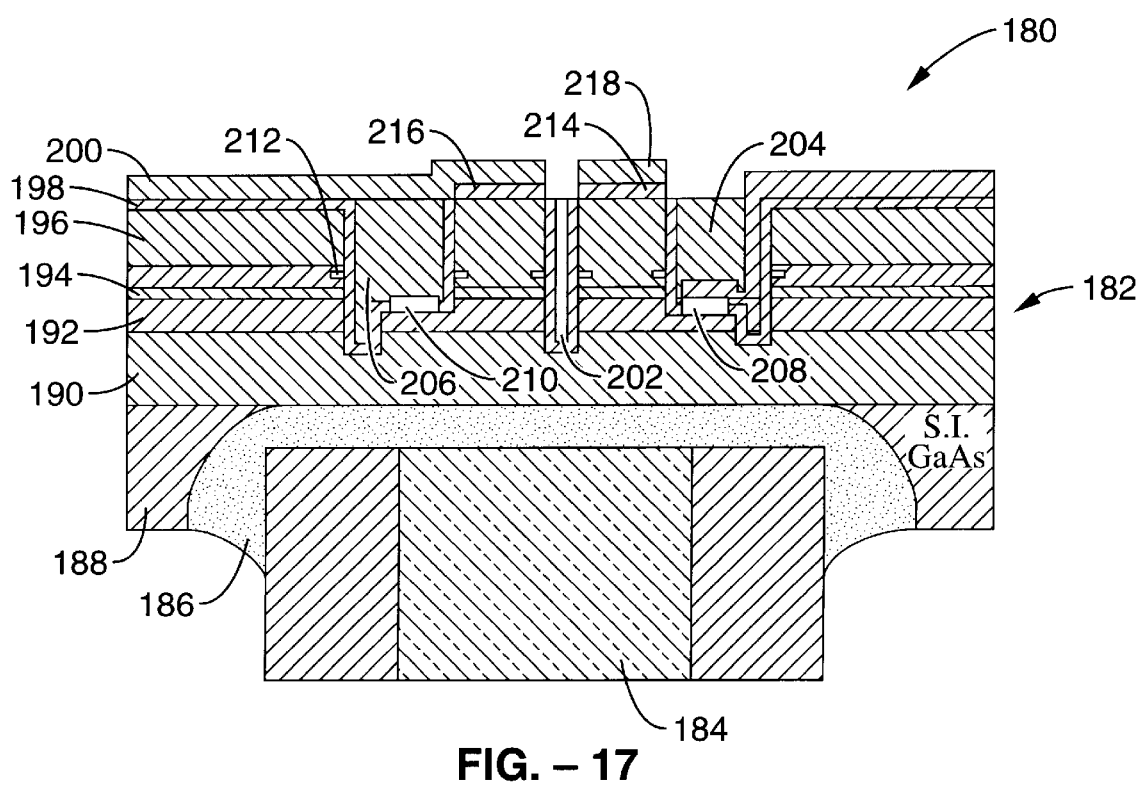
FIG. 17 is a schematic cross-section of a high-speed VCSEL PIE design according to the present invention.

FIG. 17 shows an embodiment of a high-speed VCSEL PIE design 180 according to the invention. The die 182 contains a multimode fiber 184 of the self-aligned Burrus-type [20] fiber-coupling configuration attached to the substrate with epoxy 186. The integrated circuit die 182 of this embodiment comprises the following series of layers: an S.I. GaAs substrate layer 188, an i-DBR layer 190, an n-contact layer 192, an active layer 194, an H+implanted p-DBR layer 196, an insulating isolation layer 198, and a layer of Ti/Pt/Au 200 for contacting the unimplanted p-DBR and for probing pads. Within this structure are shown wells 202, 204 and 206 filled with polyimide for isolation and planarization, n-contacts 208, 210 comprising AuGe/Ni/Au, pcontacts 214, 216 comprising Pd/Zn/Au, and contact pads 200, 218 comprising Ti/Pt/Au. As it is illustrated, the p-contacts 214, 216 are on top of the VCSEL while the n-contacts 208, 210 have an intra-cavity configuration.

(b) RCPD receivers

For the direct-coupled WDM receiver designs according to the invention, RCPDs are also made in a circular device arrangement, just like the VCSEL PIE arrays, to facilitate broadcast-type wavelength demultiplexing. Therefore, when the optical fiber is aligned and slightly defocused to the center of the pie array, all eight elements will be equally illuminated with all input wavelengths, but each of them will only pick up the specific channel which lies within its absorption band. A splitting loss of 13 dB has been observed in this configuration at 1.55 μm with a single-mode fiber, which is close to the 11 dB theoretical value [9],[10]. Based on the same technology, we can also construct a WDM photodetector arrays at 0.98 μm in the InGaAs/AlGaAs/GaAs material system.

Figure 18:
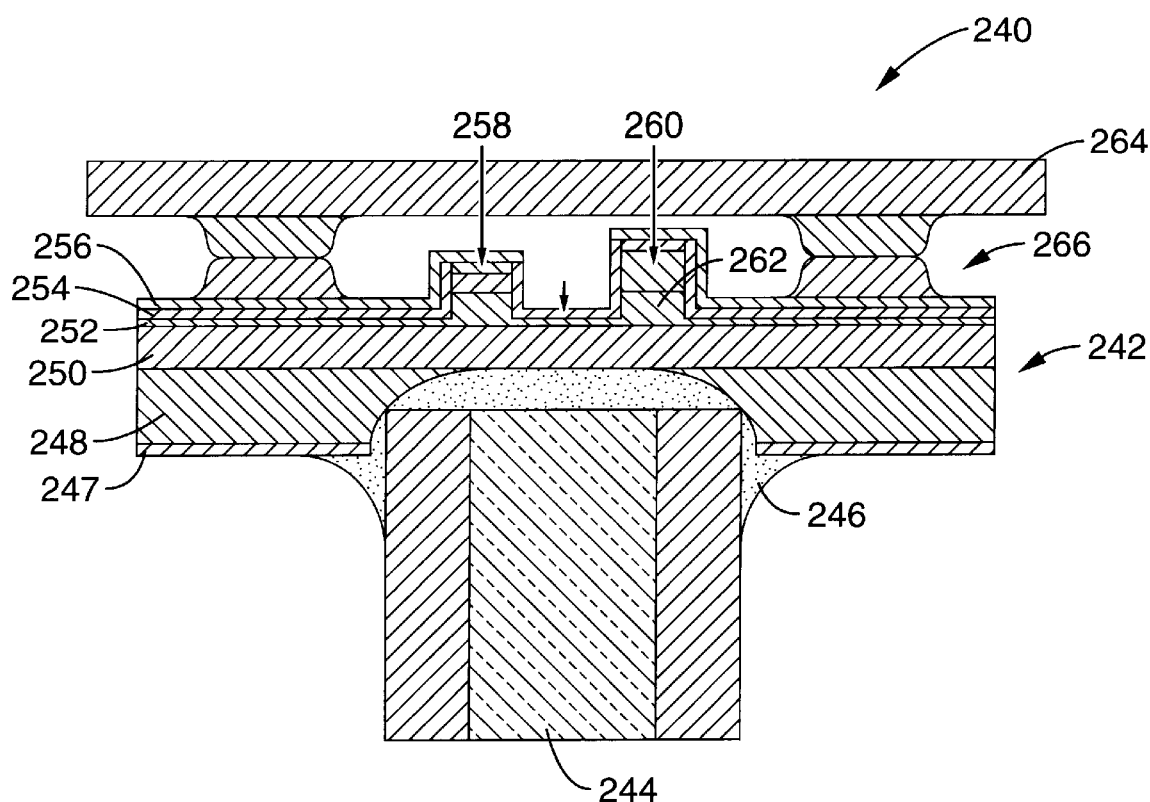
FIG. 18 is a schematic cross-section of a bottom-illuminated multiple-channel resonant-cavity Schottky photodetector array according to the present invention.

FIG. 18 shows a schematic cross-section of a bottom-illuminated multiple-channel resonant-cavity Schottky photodetector array 240. The die 242 contains a multimode fiber 244 of the self-aligned Burrus-type [20] fiber-coupling configuration attached to the substrate with epoxy 246. The integrated circuit die 242 of this embodiment comprises the following series of layers: an AuGeNi layer 247, a GaAs substrate layer 248, an AlGaAs/GaAs n-DBR layer 250, a residual absorber layer 252, a SiN$_x$ isolation layer 254, a contact pad metallization layer 256, an AuTiPtAu contact metallization 258, an AlGaAs tunable thickness cavity 260, and an absorber layer 262. The die structure 242 is attached to a submount 264 by means of solder pads 266 for electrical contacting and heat sinking.

Figure 19:
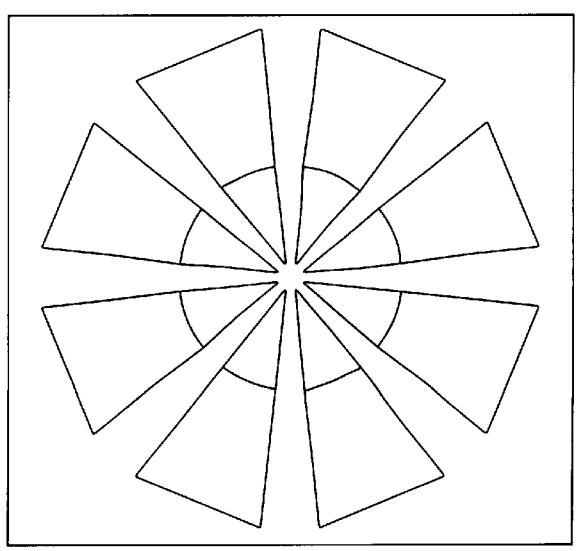
FIG. 19 is a diagrammatic top view of a finished eight-channel "pie"-shaped photodetector array according to the present invention.

FIG. 19 is a rendering of a scanning-electron micrograph (SEM) image of a finished eight-channel "pie"-shaped photodetector array for 0.98-μm WDM optical data links. These devices are narrow-band resonant-cavity Schottky photodiodes with the Schottky Au metal as the back mirror and the AlGaAs DBR as the front mirror. Cavity modes for the individual devices can be adjusted by performing anodic oxidation on the i-AlGaAs phase-tuning layers.

Schottky and P-i-N structures are the two common designs for high-performance photodiodes in either bottom-illuminating or top-illuminating configuration, which can be used to create narrow-band WDM resonant-cavity photodetectors.

Figure 20:
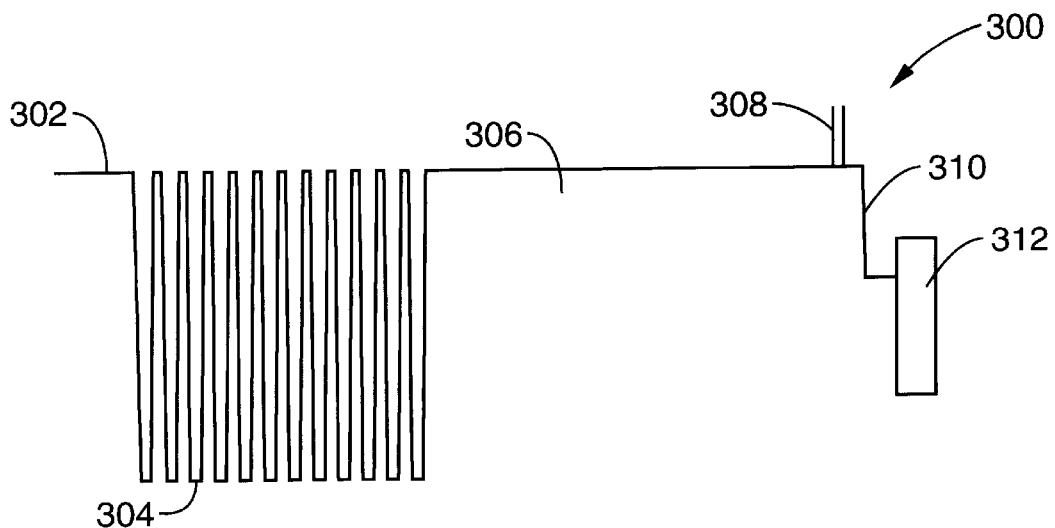
FIG. 20 is a diagram of refractive index profile for a bottom-illuminated Schottky structure according to the present invention.

FIG. 20 shows the refractive index profile 300 for a bottom-illuminated Schottky structure having a narrow-band RCPD design. The structure comprises a p-GaAs substrate 302, a front AlGaAs DBR 304, a GaAs cavity 306, a double GaAs QW absorber 308, a phase tuning layer 310, and an Au mirror 312.

Figure 21:
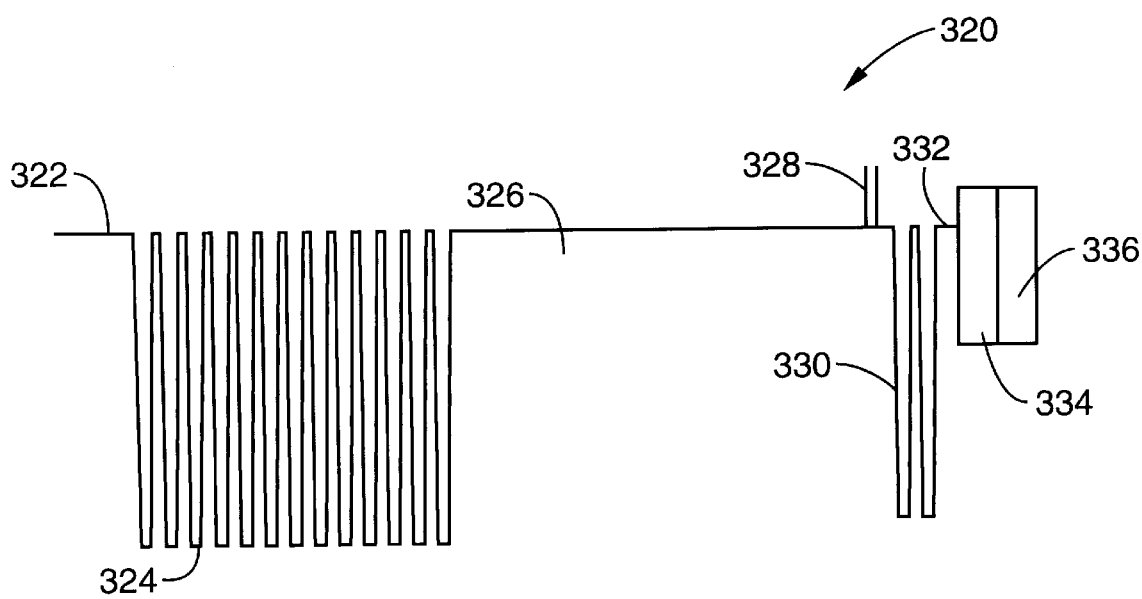
FIG. 21 is a diagram of the refractive index profile for a P-i-N structure according to the present invention.

FIG. 21 shows the profile 320 for a P-i-N structure with a few mirror periods on top to reduce the sensitivity to the tuning layer thickness. The structure comprises a substrate 322, a bottom (front) DBR composed of i-Al$_{0.98}$Ga$_{0.02}$As and Al$_{0.32}$Ga$_{0.68}$As layers 324, a Al$_{0.32}$Ga$_{0.68}$As cavity 326, a dual GaAs QW absorber 328, a few periods of back mirror 330, a phase tuning layer 332, an SiO$_2$ isolation layer 334, and an Au layer 336 to complete the top (back) mirror.

The SiO$_2$ layer in the P-i-N design is employed to prevent Au spiking into the lattice during contact annealing and to increase the back-mirror reflectivity. From the processing point of view, the Schottky structure is substantially simpler as the Schottky Au metal itself can be used as the back reflection mirror. However, the interface between the Au Schottky metal and the high Al-content semiconductor layer is not very stable. Degradation in photoresponse has been observed in previous In$_{0.52}$Al$_{0.48}$As/Au devices. Moreover, the photoresponse bandwidth has also been limited by the finite absorption in Au. Therefore, the alternative P-i-N solution becomes much more attractive. A novel P-i-N photodetector design is therefore proposed within the current invention which employs an anti-resonant oxide aperture.

FIG. 22 shows a device schematic for a P-i-N photodetector 360. The device comprises an S.I. GaAs substrate layer 362, a bottom DBR mirror 386, an i-GaAs cavity 366, an n$^+$-GaAs bottom contact layer to which metal contacts 382 and 384 are applied, an InGaAs QW absorber 370, a p-DBR mirror stack 372, a p-GaAs tuning layer 374, a p-contact metal 376 enclosing a SiO$_2$ layer 378 that isolates the contact from the optical mode, and an Au mirror 380. Underneath the ring p-contact 376, the Al$_{0.98}$Ga$_{o.02}$As layers in the top DBR mirror 372 will be oxidized after the mesa etching to increase the DBR reflectivity to almost one. As a result, the undesired absorption underneath the ring p-contact which may cause line width broadening in the photoresponses can be eliminated over the whole channel span (~30 nm).

FIG. 23 shows the theoretical reflectivity spectra for positions under the Au back mirror 380 with tuning layer thicknesses of (solid curves, from left to right) 0.40, 0.50, and 0.62λ, respectively. The dashed curves are for positions under the ring p-contact 376 with the same tuning layer thicknesses. As can be seen, the undesired absorption outside the central SiO$_2$/Au detection region has been significantly suppressed over the whole wavelength-tuning range of interest. However, the wavelength-tuning behavior for the P-i-N design is not linear, for the same reason described earlier in the VCSEL section.

Figure 24:
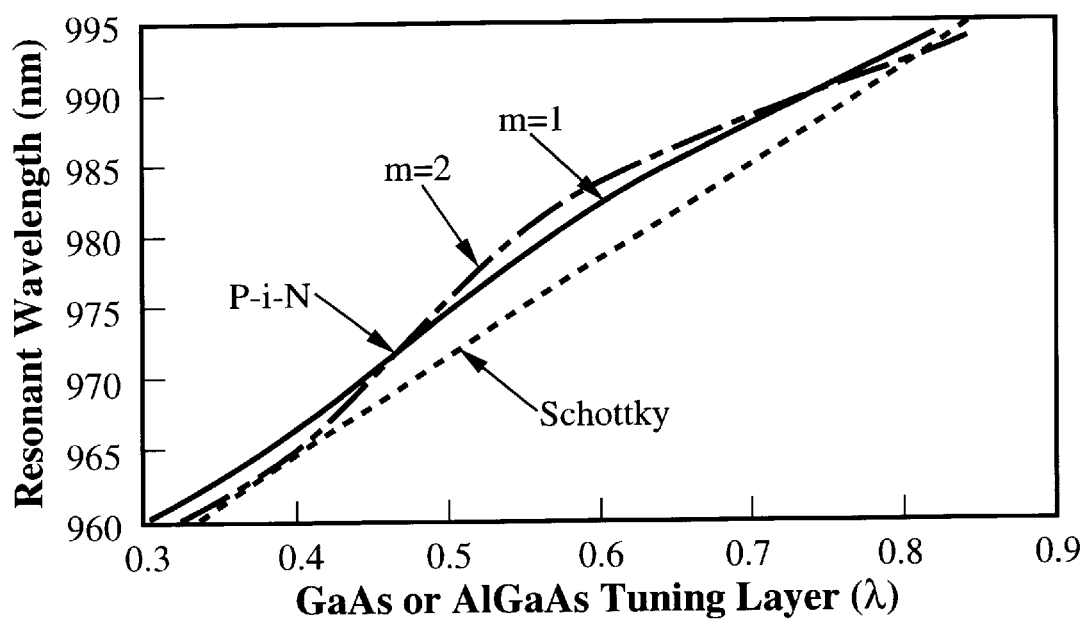
FIG. 24 is a graph comparing theoretical cavity-mode tuning characteristics for the bottom-illuminated Schottky and P-i-N photodetector designs shown in FIG. 18 and FIG. 22, respectively.

FIG. 24 compares theoretical cavity-mode tuning characteristics for the bottom-illuminated Schottky and P-i-N photodetector designs shown in FIG. 18 and FIG. 22. In this calculation, the back DBR mirror for the P-i-N structure is assumed to be 0.5 period (solid curve, m=1) or 1.5 periods (dash-dotted curve, m=2) and the $SiO_2$ layer is 100 nm.

In terms of photoresponse characteristics, it is very desirable to have passbands with flat tops and steep sides. A novel coupled-cavity structure has been proposed earlier to implement this requirement [11]. The idea is to add a low-loss cavity that is optically coupled to the absorptive cavity via an intermediate mirror.

Figure 25:
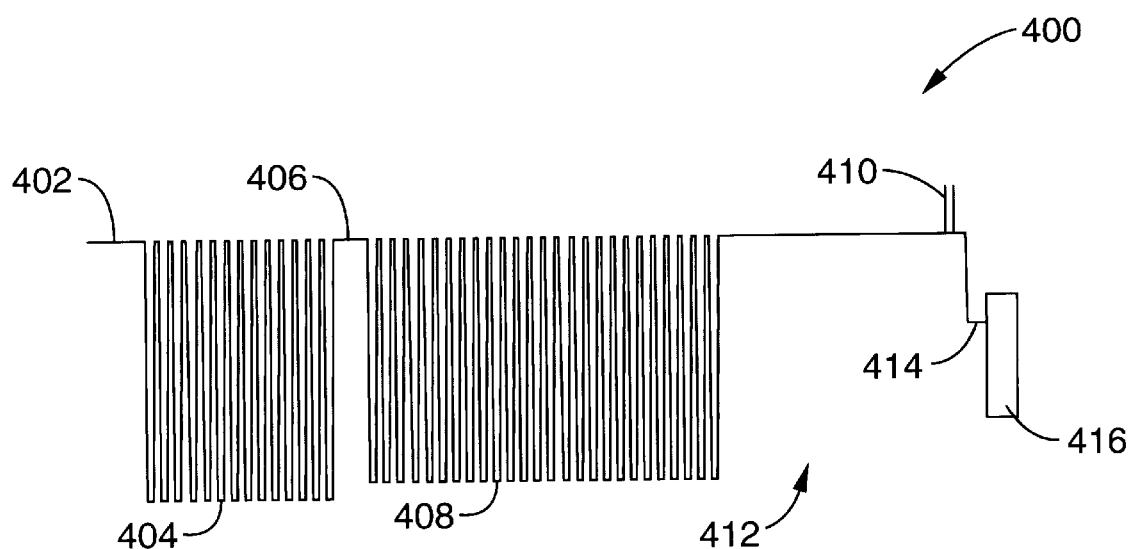
FIG. 25 is a diagram of the refractive index profile of a coupled-cavity Schottky photodiode design according to the present invention.
Figure 26:
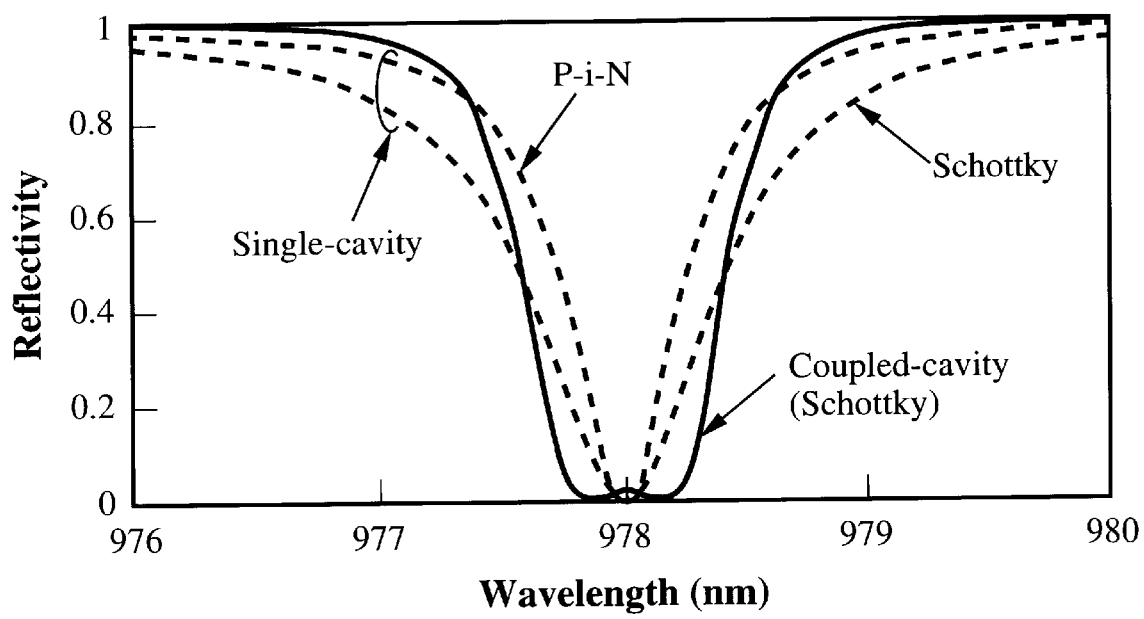
FIG. 26 is a graph of the theoretical reflectivity spectra for the single-cavity (both Schottky and P-i-N) and the coupled-cavity (Schottky) structures according to the present invention.

FIG. 25 shows the refractive index profile 400 of a coupled-cavity Schottky photodiode design. The coupling of two cavities is desired to flatten the peak and steepen the sides of the photoresponse curve. The design comprises a GaAs substrate 402, a front (bottom) DBR mirror of GaAs/$Al_{0.98}Ga_{0.02}As$ 404, a front GaAs cavity 406, a central coupling mirror of GaAs/$Al_{0.92}Ga_{0.08}As$ 408, a dual InGaAs QW absorber 410, a back (top) GaAs cavity 412, a phase tuning layer 414, and an Au mirror 416. Preliminary experimental results clearly demonstrate the expected coupled-cavity effect. Modeling for an InGaAs/GaAs/AlGaAs design reveals that this new coupled-cavity structure will be able to show a 30-dB channel rejection ratio (in term of optical power) even when the optical channel spacing is as narrow as 1 nm. FIG. 26 shows a comparison of the theoretical reflectivity spectra for the single-cavity (both Schottky and P-i-N) and the coupled-cavity (Schottky) structures, where the absorption coefficient for at InGaAs QWs is assumed to be 1.0 $\mu m^{-1}$.

Figure 27:
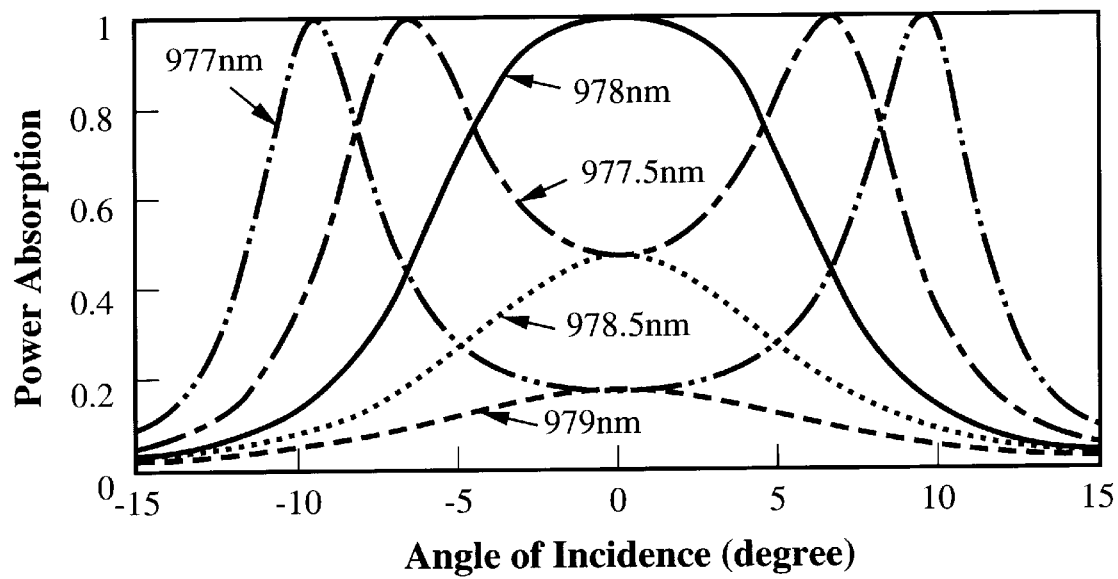
FIG. 27 is a graph of angular variation in relation to optical power absorption for incident planar waves for the Schottky design shown in FIG. 18 with a normally-incident resonant wavelength of 978 nm.
Figure 28:
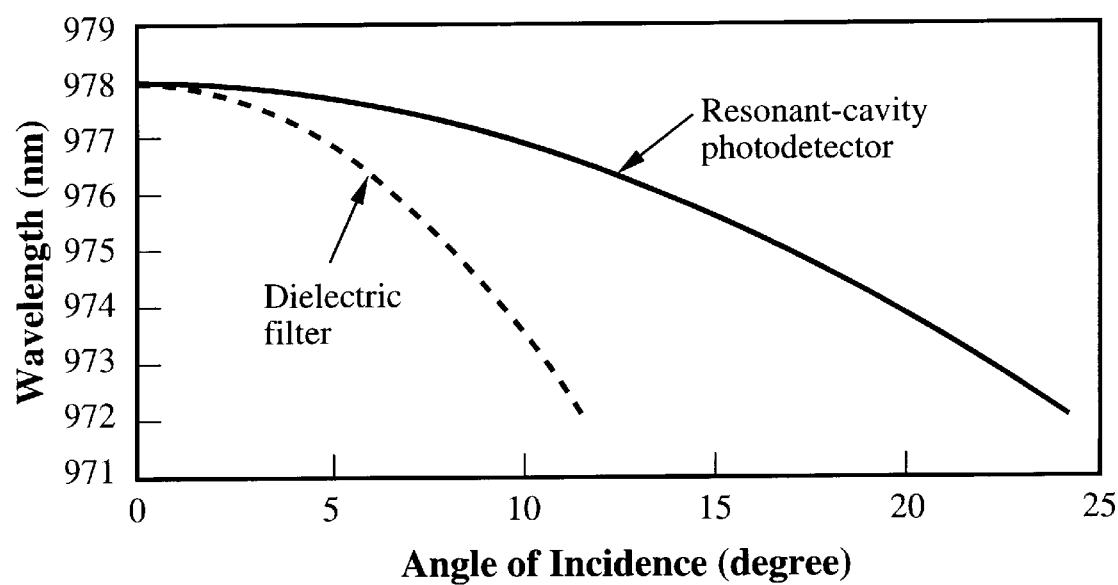
FIG. 28 is a graph of the angular variation of the resonant wavelength using a resonant-cavity photodetector (solid curve) or a $SiO_2/SiN_x$ dielectric filter (dash curve) design according to the present invention.

Contrary to the demand for a high numerical aperture in the transmitter design to reduce modal noise effects, a large numerical aperture in optical fiber will significantly deteriorate the photodetector performance. FIG. 27 shows the angular variation of optical power absorption for incident planar waves of different wavelengths for the Schottky design shown in FIG. 18 with a normally-incident resonant wavelength of 978 nm. It can be seen from the graph, that the apparent resonant wavelength varies with the incident angle. This effect causes the photoresponse to broaden and thus limits the minimum channel spacing. Nevertheless, the problem is much more severe for the conventional discrete dielectric filter and photodetector approach. FIG. 28 shows a comparison of the angular variation of the resonant wavelength by using a resonantcavity photodetector (solid curve) or a $SiO_2/SiN_X$ dielectric filter (dash curve) design. The resonant-cavity photodetector design can have either dielectric or semiconductor DBRs. As one can see, for the 62.5 $\mu$m-core fiber with a numerical aperture of 0.275, the resonant-cavity photodetector design can allow a much narrower channel spacing than the discrete dielectric filter approach.

Accordingly, a novel double-absorber design was described which avoids position sensitivity related to the cavity standing wave and eliminates the need for in-situ cavity-mode adjustment [12]. The idea is to set the center-to-center spacing of the two thin QW absorption layers at $\lambda/4$ so that the field$^2$-absorption integral is independent of the position of the absorbers relative to the cavity standing wave. This is especially important within the disclosed embodiment as the cavity modes in an array will be varied over a wavelength span of around 30 nm, and it is crucial to maintain a reasonable balance between mirror reflections and cavity losses over the entire range in order to obtain a uniform photoresponse in each array. Moreover, in order to reduce crosstalk between channels, these devices are designed with a high-Q cavity by minimizing cavity losses and increasing cavity length to obtain narrow-band photoresponse. In addition, a novel coupled-cavity structure is proposed to achieve passbands with flat tops and steep sides to approach the ideal square-shape photoresponse and to ensure proper channel alignment [11]. Although the description above contains many specificities, these should not be construed as limiting the scope of the invention but as merely providing illustrations of some of the presently preferred embodiments of this invention.

What is claimed is:

1. An optical data link, comprising:

(a) an array of vertical cavity surface emitting laser (VCSEL) emitters, operating at predetermined wavelengths, fabricated within a substrate configured for simultaneous direct coupling of the VCSEL array to an optical fiber;

(b) an optical fiber capable of communicating multiple optical wavelengths; and (c) an array of optical detectors coupled to a terminating end of said optical fiber, wherein a set of reception wavelengths generally match the wavelengths transmitted by the optical VCSEL emitters such that multiple optical wavelengths can be simultaneously communicated at high-speed from the emitters to the detectors across the optical fiber.

2. An optical data link as recited in claim 1, wherein said VCSEL emitters are selected from the group consisting of bottom-emitting VCSEL emitters and top-emitting VCSEL emitters.

3. An optical data link as recited in claim 1, wherein said optical detectors comprise resonant cavity photodetectors having a double-absorber design with a field$^2$-absorption integral that is independent of absorber position relative to the cavity standing wave, and wherein each said optical detector includes two thin quantum well absorption layers spaced apart at an approximate quarter-wavelength spacing.

4. An optical data link as recited in claim 1, wherein the VCSEL array is configured as a circular array of VCSEL emitters.

5. An optical data link as recited in claim 1, wherein the VCSEL array is configured with "pie-shaped" optical elements arranged in a circle.

6. An optical data link as recited in claim 1, wherein said optical fiber is coupled to said VCSEL array by the use of a self-aligned Burrus-type fiber-coupling configuration.

7. An optical data link as recited in claim 1, wherein said array of optical detectors comprises a resonant-cavity photodetector array directly coupled to the optical fiber.

8. An optical data link as recited in claim 1, wherein the VCSEL emitters are wavelength adjustable.

9. An optical data link comprising:

(a) an array of vertical cavity surface emitting laser (VCSEL) emitters configured for direct coupling to an optical fiber, wherein the VCSEL emitters operate at various predetermined emission wavelengths;

(b) an array of resonant cavity photodetector (RCPD) detectors configured for direct coupling to an optical fiber, said RCPD detectors having reception wavelengths generally corresponding to the emission wavelengths of the VCSEL emitters;

(c) an optical fiber directly coupled between the VCSEL emitter array and RCPD array, wherein multiple optical wavelengths can be simultaneously communicated at high-speed from the emitters to the detectors across the optical fiber.

10. An optical data link, as recited in claim 9, wherein the VCSEL emitters are wavelength adjustable.

11. A method of creating a multiple band optical link, comprising the steps of:

(a) fabricating a vertical cavity surface emitting laser (VCSEL) emitter array on a substrate, wherein the VCSEL emitters are arranged in a circular pattern on the substrate and each VCSEL emitter is set for a different emissive wavelength;

(b) configuring the substrate with the VCSEL emitters for Burrus-type selfaligning fiber-coupling;

(c) fabricating a resonant-cavity photodetector (RCPD) detector array on a substrate, wherein the RCPD detectors are arranged in a circular pattern on the substrate and each RCPD is set to detect a different emissive wavelength;

(d) configuring the substrate of the RCPD detector array for Burrus-type self-aligning fiber-coupling;

(e) bonding the substrates of the VCSEL emitter array and RCPD detector array onto electronic circuits configured to receive the respective emitter and detector arrays; and (f) bonding a multi-mode fiber between the VCSEL emitter and RCPD detector, wherein said bonding is created by means of Burrus-style coupling.

* * * * *